United States Patent
Yu et al.

(10) Patent No.: US 12,278,182 B2
(45) Date of Patent: Apr. 15, 2025

(54) VERTICAL SEMICONDUCTOR DEVICE

(71) Applicant: Samsung Electronics Co., Ltd., Suwon-si (KR)

(72) Inventors: Changyeon Yu, Hwaseong-si (KR); Pansuk Kwak, Goyang-si (KR); Daeseok Byeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 522 days.

(21) Appl. No.: 17/721,481

(22) Filed: Apr. 15, 2022

(65) Prior Publication Data
US 2022/0399273 A1    Dec. 15, 2022

(30) Foreign Application Priority Data

Jun. 15, 2021    (KR) .................. 10-2021-0077261

(51) Int. Cl.
  *H01L 23/528*    (2006.01)
  *G11C 16/08*    (2006.01)
  (Continued)

(52) U.S. Cl.
  CPC .......... *H01L 23/5283* (2013.01); *G11C 16/08* (2013.01); *H10B 41/10* (2023.02); *H10B 41/27* (2023.02); *H10B 41/40* (2023.02); *H10B 41/50* (2023.02); *H10B 43/10* (2023.02); *H10B 43/27* (2023.02); *H10B 43/40* (2023.02); *H10B 43/50* (2023.02)

(58) Field of Classification Search
  CPC ........ H10B 43/50; H10B 41/50; H10B 43/35; H10B 41/35; H10B 43/10; H10B 41/10
  See application file for complete search history.

(56) References Cited

U.S. PATENT DOCUMENTS 6,839,264 B2    1/2005   Sekine et al.
7,582,921 B2    9/2009   Sekiguchi et al.
(Continued)

FOREIGN PATENT DOCUMENTS

| JP | 1995-0183301 A | 7/1995 |
| KR | 10-0693879 B1 | 12/2006 |
| KR | 10-2014-0093038 A | 7/2014 |

OTHER PUBLICATIONS

Korean Office Action dated Jan. 10, 2025 issued in Korean Patent Application No. 10-2021-0077261.

*Primary Examiner* — Alia Sabur
(74) *Attorney, Agent, or Firm* — Harness, Dickey & Pierce, P.L.C.

(57) ABSTRACT

A vertical memory device may include a first conductive line structure and an address decoder. The first conductive line structure may be on a substrate. The first conductive line structure may include conductive lines and insulation layers alternately and repeatedly stacked in a direction perpendicular to the substrate. The address decoder may be connected to a first end of each of conductive lines included in the first conductive line structure. The address decoder may apply electrical signal to the conductive lines. In each of the conductive lines, a first portion adjacent to the first end and a second portion adjacent to a second end may have different shapes. A first resistance in the first portion may be lower than a second resistance in the second portion. RC delay of the conductive lines may be reduced.

19 Claims, 27 Drawing Sheets

(51) Int. Cl.
  *H10B 41/10* (2023.01)
  *H10B 41/27* (2023.01)
  *H10B 41/40* (2023.01)
  *H10B 41/50* (2023.01)
  *H10B 43/10* (2023.01)
  *H10B 43/27* (2023.01)
  *H10B 43/40* (2023.01)
  *H10B 43/50* (2023.01)

(56) References Cited

U.S. PATENT DOCUMENTS

| | | |
|---|---|---|
| 8,158,333 B2 | 4/2012 | Hashimoto |
| 10,461,030 B2 | 10/2019 | Hwang et al. |
| 10,818,729 B2 | 10/2020 | Lung et al. |
| 2006/0284259 A1 | 12/2006 | Lee et al. |
| 2016/0343728 A1* | 11/2016 | Song ................... G11C 16/0483 |
| 2017/0092655 A1* | 3/2017 | Jung ....................... H10B 43/10 |
| 2019/0355737 A1* | 11/2019 | Lee ...................... H01L 23/5283 |
| 2019/0393241 A1* | 12/2019 | Baek ...................... H10B 43/27 |
| 2020/0411543 A1* | 12/2020 | Wang ................. H01L 21/02636 |

* cited by examiner

VERTICAL SEMICONDUCTOR DEVICE

CROSS-REFERENCE TO RELATED APPLICATION

This application claims priority under 35 USC § 119 to Korean Patent Application No. 10-2021-0077261, filed on Jun. 15, 2021, in the Korean Intellectual Property Office (KIPO), the contents of which are incorporated by reference herein in their entirety.

BACKGROUND

1. Field

Example embodiments relate to vertical semiconductor devices. Particularly, example embodiments relate to vertical semiconductor devices in which RC delay of conductive lines stacked in a vertical direction is decreased.

2. Description of the Related Art

Recently, a vertical semiconductor device in which memory cells are stacked in a direction perpendicular to a surface of a substrate has been developed. The memory cells may include conductive lines stacked in a vertical direction, and the conductive lines for transmitting electrical signals at a high speed may be required.

SUMMARY

Example embodiments provide vertical semiconductor devices having a high performance.

According to an example embodiment, a vertical semiconductor device includes a first conductive line structure and an address decoder. The first conductive line structure may be on a substrate. The first conductive line structure may include conductive lines and insulation layers alternately and repeatedly stacked in a vertical direction perpendicular to a surface of the substrate. The address decoder may be connected to a first end of each of conductive lines included in the first conductive line structure. The address decoder may be configured to apply electrical signals to the conductive lines. In each of the conductive lines, a first portion adjacent to the first end and a second portion adjacent to a second end that is opposite to the first end may have different shapes. A first resistance in the first portion may be lower than a second resistance in the second portion.

According to an example embodiment, a vertical semiconductor device includes a first conductive line structure, a second conductive line structure, a first address decoder, and a second address decoder. The first conductive line structure may be on a substrate. The first conductive line structure may include first conductive lines and first insulation layers alternately and repeatedly stacked in a vertical direction perpendicular to an upper surface of the substrate. The first conductive line structure may elongate longer in a first direction parallel to the upper surface of the substrate and each of the first conductive lines may include a first end and a second end opposite to the first end. The second conductive line structure may be formed on the substrate. The second conductive line structures may include second conductive lines and second insulation layers alternately and repeatedly stacked in the vertical direction. The second conductive line structure may elongate in the first direction and each of the second conductive lines may include a third end and a fourth end opposite to the third end. The first address decoder may be connected to the first end and configured to apply electrical signals. The second address decoder may be connected to the third end and configured to apply electrical signals. The first conductive line structure and the second conductive line structure may alternate in a second direction parallel to the upper surface of the substrate and perpendicular to the first direction. The first conductive line structure and the second conductive line structure may be separated by an opening interposed therebetween and extending in the first direction. In a plan view, a first width in a first portion adjacent to the first end may be greater than a second width in a second portion adjacent to the second end in each of the first conductive lines. In the plan view, a third width in a third portion adjacent to the third end may be greater than a fourth width in a fourth portion adjacent to the fourth end in each of the second conductive lines. The third end may be adjacent to the second end in the second direction.

According to an example embodiment, a vertical semiconductor device includes a conductive line structure, upper conductive lines and an address decoder. The conductive line structure may be formed on a substrate. The conductive line structure may include first conductive lines and first insulation layers alternately and repeatedly stacked in a vertical direction perpendicular to a surface of the substrate. The upper conductive lines may be on the conductive line structure. The address decoder may be connected to a first end of each of the first conductive lines included in the conductive line structure and configured to apply electrical signals. The upper conductive lines may include a trench therebetween. The trench may extend in a diagonal direction inclined with respect to a first direction parallel to the surface of the substrate.

According to an example embodiment, the conductive lines may transmit electrical signals at a high speed due to reduced RC delay. Thus, a charging time required for the conductive lines to have a target voltage may be reduced. Further, the conductive lines may have a sufficient target length in a first direction.

BRIEF DESCRIPTION OF THE DRAWINGS

Example embodiments will be more clearly understood from the following detailed description taken in conjunction with the accompanying drawings. FIGS. 1 to 28 represent non-limiting, example embodiments as described herein.

FIG. 1 is a block diagram of a vertical semiconductor device in accordance with an example embodiment;

FIG. 2 is a block diagram illustrating an electronic system including a semiconductor device in accordance with an example embodiment;

FIG. 3 is a schematic perspective view illustrating an electronic system including a semiconductor device in accordance with an example embodiment;

FIGS. 4, 5A, and 5B are a plan view and cross-sectional views illustrating a vertical semiconductor device in accordance with an example embodiment;

FIG. 6 is a perspective view illustrating a portion of a conductive line structure in the vertical semiconductor device in accordance with an example embodiment;

FIG. 7 is a plan view of a conductive line structure of the vertical semiconductor device in accordance with an example embodiment;

FIG. 8 is a plan view of a conductive line structure of a vertical semiconductor device for comparison with the conductive line structure of the vertical semiconductor device in accordance with an example embodiment;

FIG. 9 is a plan view of a conductive line structure of a vertical semiconductor device in accordance with an example embodiment;

FIG. 10 is a plan view of a conductive line structure of a vertical semiconductor device in accordance with an example embodiment;

FIG. 11 is a plan view of a vertical semiconductor device in accordance with an example embodiment;

FIGS. 12 and 13 are a plan view and a cross-sectional view illustrating a vertical semiconductor device in accordance with an example embodiment;

FIGS. 14 and 15 are a perspective view and a cross-sectional view illustrating a vertical semiconductor device in accordance with an example embodiment;

FIG. 16 is a perspective view illustrating a portion of a conductive line structure in the vertical semiconductor device in accordance with an example embodiment;

FIG. 17 is a perspective view illustrating a portion of a conductive line structure in a vertical semiconductor device in accordance with an example embodiment;

FIG. 18 is a perspective view illustrating a portion of a conductive line structure in a vertical semiconductor device in accordance with an example embodiment;

FIG. 19 is a perspective view illustrating a portion of a conductive line structure in a vertical semiconductor device in accordance with an example embodiment; and FIGS. 20 to 28 are plan views and cross-sectional views illustrating a method of manufacturing a vertical semiconductor device in accordance with an example embodiment.

DETAILED DESCRIPTION

Hereinafter, a direction substantially perpendicular to an upper surface of the substrate is defined as a vertical direction, and two directions crossing with each other in horizontal directions substantially parallel to the upper surface of the substrate are defined as first and second directions, respectively. In some example embodiments, the first and second directions may be perpendicular to each other.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
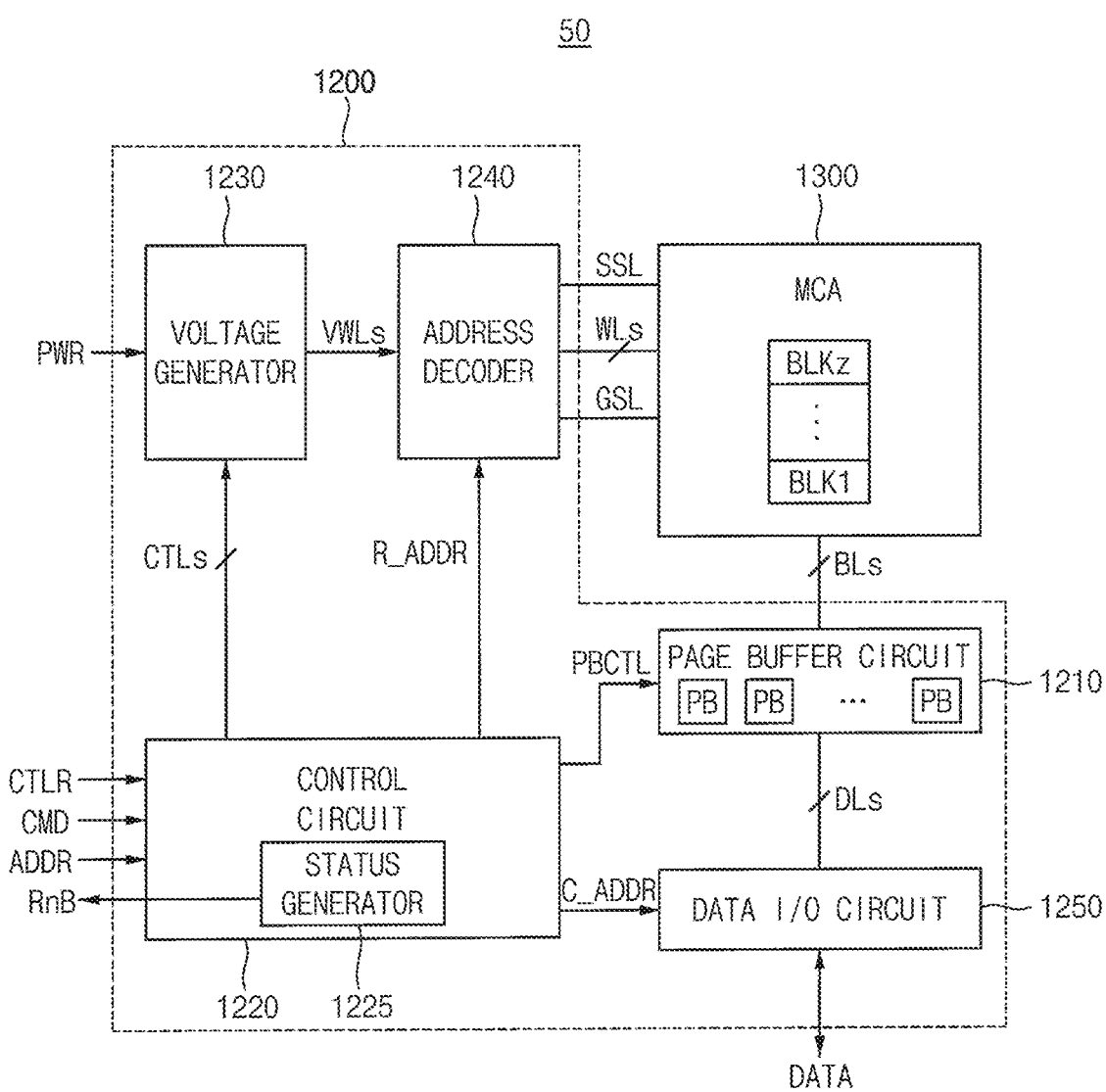

FIG. 1 is a block diagram of a vertical semiconductor device in accordance with an example embodiment.

Referring to FIG. 1, the vertical semiconductor device 50 may include a memory cell array 1300 and a peripheral circuit 1200. The peripheral circuit 1200 may include a page buffer circuit 1210, a control circuit 1220, a voltage generator 1230, an address decoder 1240, and a data input/output circuit 1250. Although not shown, the peripheral circuit 1200 may further include input/output interfaces, column logic, a pre-decoder, a temperature sensor, or the like.

The memory cell array 1300 may be connected to the address decoder 1240 via a string select line SSL, a plurality of word lines WLs, and a ground select line GSL. Also, the memory cell array 1300 may be connected to the page buffer circuit 1210 via a plurality of bit lines BLs. The memory cell array 1300 may include a plurality of nonvolatile memory cells connected to a plurality of word lines WLs and a plurality of bit lines BLs.

In some example embodiments, the memory cell array 1300 having a three-dimensional structure (or a vertical structure) may be formed on a substrate. In this case, the memory cell array 1300 may include vertical memory cell strings including a plurality of memory cells stacked in the vertical direction.

The control circuit 1220 may receive a control signal CTRL, a command signal CMD, and an address signal ADDR from a memory controller, and the control circuit 1220 may control an erase loop, a program loop, and a read operation of the vertical semiconductor device based on the control signal CTRL, the command signal CMD, and the address signal ADDR.

For example, the control circuit 1220 may generate control signals CTLs for controlling a voltage generator 1230, a page buffer control signal for controlling a page buffer circuit 1210 based on the command signal CMD, and a row address R_ADDR and a column address C_ADDR based on the address signal ADDR. The control circuit 1220 may provide the row address R_ADDR to the address decoder 1240 and the column address C_ADDR to the data input/output circuit 1250. The control circuit 1220 may include a status generator 1225 that generates a status signal (or ready/busy) for indicating an operating state of the vertical semiconductor device 50.

The address decoder 1240 may be connected to the memory cell array 1300 via a string select line SSL, a plurality of word lines WLs, and a ground select line GSL. During a program operation or a read operation, the address decoder 1240 may determine one of the plurality of word lines WLs as a selected word line based on the row address R_ADDR provided from the control circuit 1220, and may determine rest of the plurality of word-lines WLs except the selected word line as unselected word lines.

The voltage generator 1230 may generate word line voltages VWLs for operation of the vertical semiconductor device 50 by using a power PWR based on the control signals CTLs provided from the control circuit 1220. The word line voltages VWLs generated from the voltage generator 1230 may be applied to the plurality of word lines WLs through the address decoder 1240.

For example, in a program operation, the voltage generator 1230 may apply a program voltage to the selected word line, and may apply a program pass voltage to the unselected word lines. In a program verification operation, the voltage generator 1230 may apply a program verify voltage to the selected word line, and may apply a verify pass voltage to the unselected word lines. In a read operation, the voltage generator 1230 may apply a read voltage to the selected word line, and may apply a read pass voltage to the unselected word lines.

The string selection line SSL, the plurality of word lines WLs, and the ground selection line GSL may extend in the first direction parallel to a surface of the substrate. When a word line voltage is applied to the string select line SSL, the plurality of word lines WLs, and the ground select line GSL through the address decoder 1240, end portions of the string select line SSL, the plurality of word lines WLs, and the ground select line GSL that are not directly connected to the address decoder 1240 (that is, positioned far from the address decoder 1240) should be sufficiently charged to have a target word line voltage. Thus, a charging time for sufficiently charging of the end portions of the string select line SSL, the plurality of word lines WLs, and the ground select line GSL may be increased.

As lengths of the string selection line SSL, the plurality of word lines WLs, and the ground selection line GSL in the first direction increase, RC delay and the charging time of each of the string selection line SSL, the plurality of word lines WLs, and the ground selection line GSL may be increased. Therefore, it may be difficult to sufficiently increase the lengths of the string selection line SSL, the plurality of word lines WLs and the ground selection line GSL in the first direction.

In the vertical semiconductor device, the string selection line SSL, the plurality of word lines WLs and the ground selection line GSL may be vertically stacked. The string selection line SSL, the plurality of word lines WLs and the ground selection line GSL may be spaced apart in the vertical direction to be adjacent to each other. Thus, a parasitic capacitance may be generated therebetween. The RC delay of the string selection line SSL, the plurality of word lines WLs, and the ground selection line GSL may be increased due to the parasitic capacitance, and thus the charging time of the string selection line SSL, the plurality of word lines WLs, and the ground selection line GSL may be increased.

Hereinafter, conductive lines serving as the string select line SSL, the plurality of word lines WLs, and the ground select line GSL may be described. The vertical semiconductor device in accordance with some example embodiments may have a conductive line structure having the string selection line SSL, the plurality of word lines WLs and the ground selection line GSL capable of rapidly charging to have a target word line voltage.

The page buffer circuit 1210 may be connected to the memory cell array 1300 via a plurality of bit lines BLs. The page buffer circuit 1210 may include a plurality of page buffers PB. The page buffer circuit 1210 may temporarily store data to be programmed in a selected page in a program operation, and may temporarily store data read from the selected page in a read operation.

The data input/output circuit 1250 may be connected to the page buffer circuit 1210 through a plurality of data lines DLs. In the program operation, the data input/output circuit 1250 may receive program data DATA provided from the memory controller, and may supply the program data DATA to the page buffer circuit 1210 based on the column address C_ADDR provided from the control circuit 1220. In the read operation, the data input/output circuit 1250 may provide the read data DATA stored in the page buffer circuit 1210 to memory controller based on the column address C_ADDR provided from the control circuit 1220.

Figure 2:
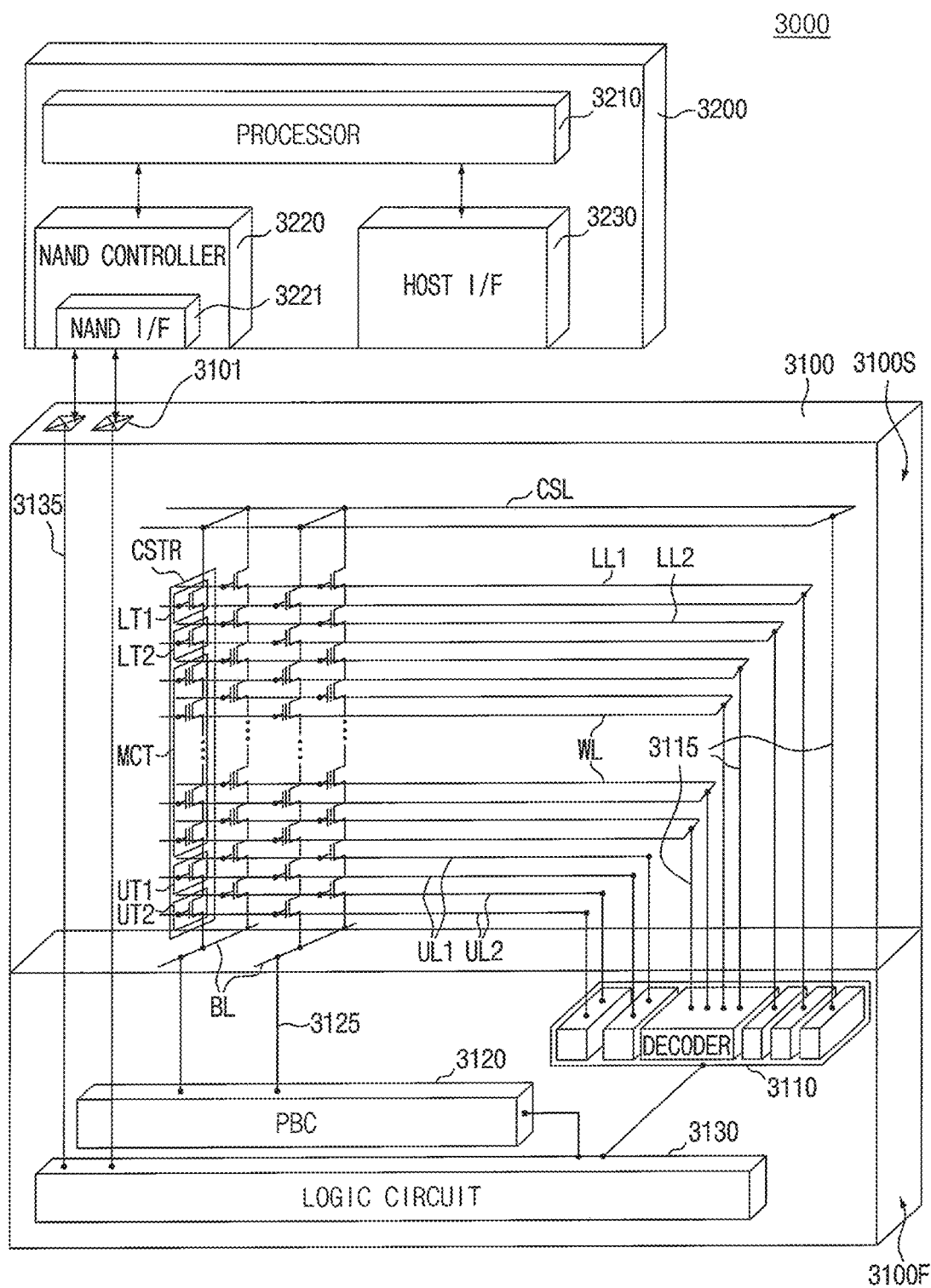

FIG. 2 is a block diagram illustrating an electronic system including a semiconductor device in accordance with an example embodiment.

Referring to FIG. 2, the electronic system 3000 may include a semiconductor device 3100 and a controller 3200 electrically connected to the semiconductor device 3100. The electronic system 3000 may be a storage device including one or a plurality of semiconductor devices 3100 or an electronic device including the storage device. For example, the electronic system 3000 may be a solid state drive (SSD) device, a universal serial bus (USB) device, a computing system, a medical device, or a communication device including one or a plurality of semiconductor devices 3100.

The semiconductor device 3100 may be a vertical semiconductor device. For example, the semiconductor device 3100 may be the vertical semiconductor device described with reference to FIG. 1.

The vertical semiconductor device may include a first structure 3100F and a second structure 3100S on the first structure 3100F.

The first structure 3100F may be a peripheral circuit structure including a decoder circuit 3110, a page buffer circuit 3120 and a logic circuit 3130. The second structure 3100S may include bit lines BL, a common source line CSL, word lines WL, first and second gate upper lines UL1 and UL2, and first and second gate lower lines LL1 and LL2, and memory cell strings CSTR between the bit line BL and the common source line CSL.

In some example embodiments, the first structure 3100F may be formed on a substrate, and the second structure 3100S may be formed on the first structure 3100F.

In the second structure 3100S, each of the memory cell strings CSTR may include lower transistors LT1 and LT2 adjacent to the common source line CSL and upper transistors UT1 and UT2 adjacent to the bit line BL, and a plurality of memory cell transistors MCT disposed between the lower transistors LT1 and LT2 and the upper transistors UT1 and UT. The number of the lower transistors LT1 and LT2 and the number of the upper transistors UT1 and UT2 may be varied in accordance with some example embodiments.

In some example embodiments, the upper transistors UT1 and UT2 may include string select transistors, and the lower transistors LT1 and LT2 may include ground select transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 that may be connected with each other in series. The upper transistors UT1 and UT2 may include a string select transistor UT1 and an upper erase control transistor UT2 that may be connected with each other in series. At least one of the lower erase control transistor LT1 or the upper erase control transistor UT1 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through a first connection wiring 3115 extending from the first structure 3100F to the second structure 3100S. The bit lines BL may be electrically connected to the page buffer circuit 3120 through a second connection wiring 3125 extending from the first structure 3100F to the second structure 3100S.

Hereinafter, conductive lines serving as the first and second lower gate lines LL1 and LL2, word lines WL, and first and second upper gate lines UL1 and UL2 may be described. In the vertical semiconductor device in accordance with some example embodiments, a conductive line structure may be rapidly charged to have the target word line voltage to the first and second lower gate lines LL1 and LL2, word lines WL, and first and second upper gate lines UL1 and UL2.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130.

The semiconductor device 3100 may communicate with the controller 3200 through an input/output pad 3101 electrically connected to the logic circuit 3130. The input/output pad 3101 may be electrically connected to the logic circuit 3130 through an input/output connection line 3135 extending from the first structure 3100F to the second structure 3100S.

The controller 3200 may include a processor 3210, a NAND controller 3220, and a host interface 3230. In some example embodiments, the electronic system 3000 may include a plurality of semiconductor devices 3100, and in this case, the controller 3200 may control the plurality of semiconductor devices 3100.

The processor 3210 may control operation of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. A control command for controlling the semiconductor device 3100, data to be written in the memory cell transistors MCT of the semiconductor device 3100, and data to be read from the memory cell transistors MCT of the semiconductor device 3100, etc., may be transferred by the NAND interface 3221. The host interface 3230 may provide communication between the electronic system 3000 and an external host. When control command is received from the external host through the host interface 3230, the processor 3210 may control the semiconductor device 3100 in response to the control command.

Figure 3:
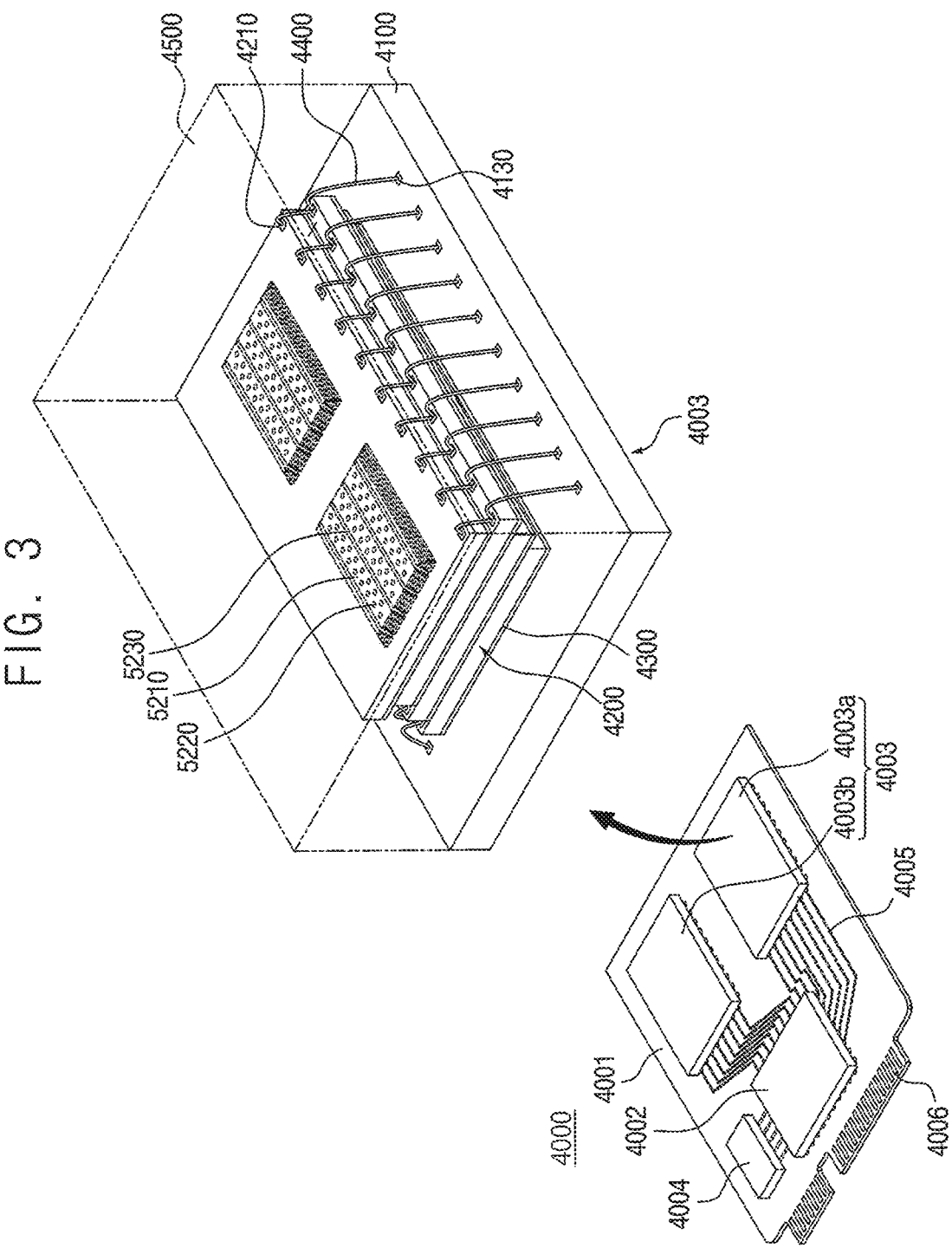

FIG. 3 is a schematic perspective view illustrating an electronic system including a semiconductor device in accordance with an example embodiment.

Referring to FIG. 3, the electronic system 4000 may include a main board 4001, a controller 4002 mounted on the main board 4001, one or more semiconductor packages 4003, and a dynamic random access memory (DRAM) device 4004. The semiconductor package 4003 and the DRAM device 4004 may be connected to the controller 4002 by wiring patterns 4005 on the main board 4001.

The main board 4001 may include a connector 4006 including a plurality of pins coupled to an external host. The number and arrangement of the plurality of pins in the connector 4006 may be changed depending on a communication interface between the electronic system 4000 and the external host. In some example embodiments, the electronic system 4000 may communicate with the external host according to one of interfaces, e.g., a USB, peripheral component interconnect express (PCI-Express), serial advanced technology attachment (SATA), M-PHY for universal flash storage (UFS), etc. In some example embodiments, the electronic system 4000 may be operated by power supplied from an external host through the connector 4006. The electronic system 4000 may further include a power management integrated circuit (PMIC) for distributing the power supplied from the external host to the controller 4002 and the semiconductor package 4003.

The controller 4002 may write data in the semiconductor package 4003 or read data from the semiconductor package 4003, and may enhance an operating speed of the electronic system 4000.

The DRAM device 4004 may be a buffer memory for reducing a speed difference between the semiconductor package 4003 for storing data and an external host. The DRAM device 4004 included in the electronic system 4000 may serve as a cache memory, and may provide a space for temporarily storing data in a control operation of the semiconductor package 4003. When the electronic system 4000 includes the DRAM device 4004, the controller 4002 may further include a DRAM controller for controlling the DRAM device 4004 in addition to the NAND controller for controlling the semiconductor package 4003.

The semiconductor package 4003 may include first and second semiconductor packages 4003a and 4003b spaced apart from each other. Each of the first and second semiconductor packages 4003a and 4003b may be a semiconductor package including a plurality of semiconductor chips 4200. Each of the first and second semiconductor packages 4003a and 4003b may include a package substrate 4100, the semiconductor chips 4200 on the package substrate 4100, and adhesive layers 4300 on lower surfaces of the semiconductor chips 4200, a connection structure 4400 for electrically connecting the semiconductor chips 4200 and the package substrate 4100, and a mold layer 4500 covering the semiconductor chips 4200 and the connection structure 4400 on the package substrate 4100.

The package substrate 4100 may be a printed circuit board (PCB) including package upper pads 4130. Each of the semiconductor chips 4200 may include an input/output pad 4210. Each of the semiconductor chips 4200 may include gate electrode structures 5210, memory channel structures 5220 passing through each gate electrode structures 5210, and division structures 5230 for separating the gate electrode structures 5210. Each of the semiconductor chips 4200 may include the vertical semiconductor device described with reference to FIG. 1 or 2.

In some example embodiments, the connection structure 4400 may be a bonding wire for electrically connecting the input/output pad 4210 and the package upper pads 4130.

A nonvolatile memory device or a storage device in accordance with some example embodiments may be mounted using various package types or package configurations.

Hereinafter, a vertical semiconductor device in accordance with some example embodiments may be described in more detail. For example, the vertical semiconductor device including the conductive lines for reducing RC delay may be described in more detail.

Figure 4:
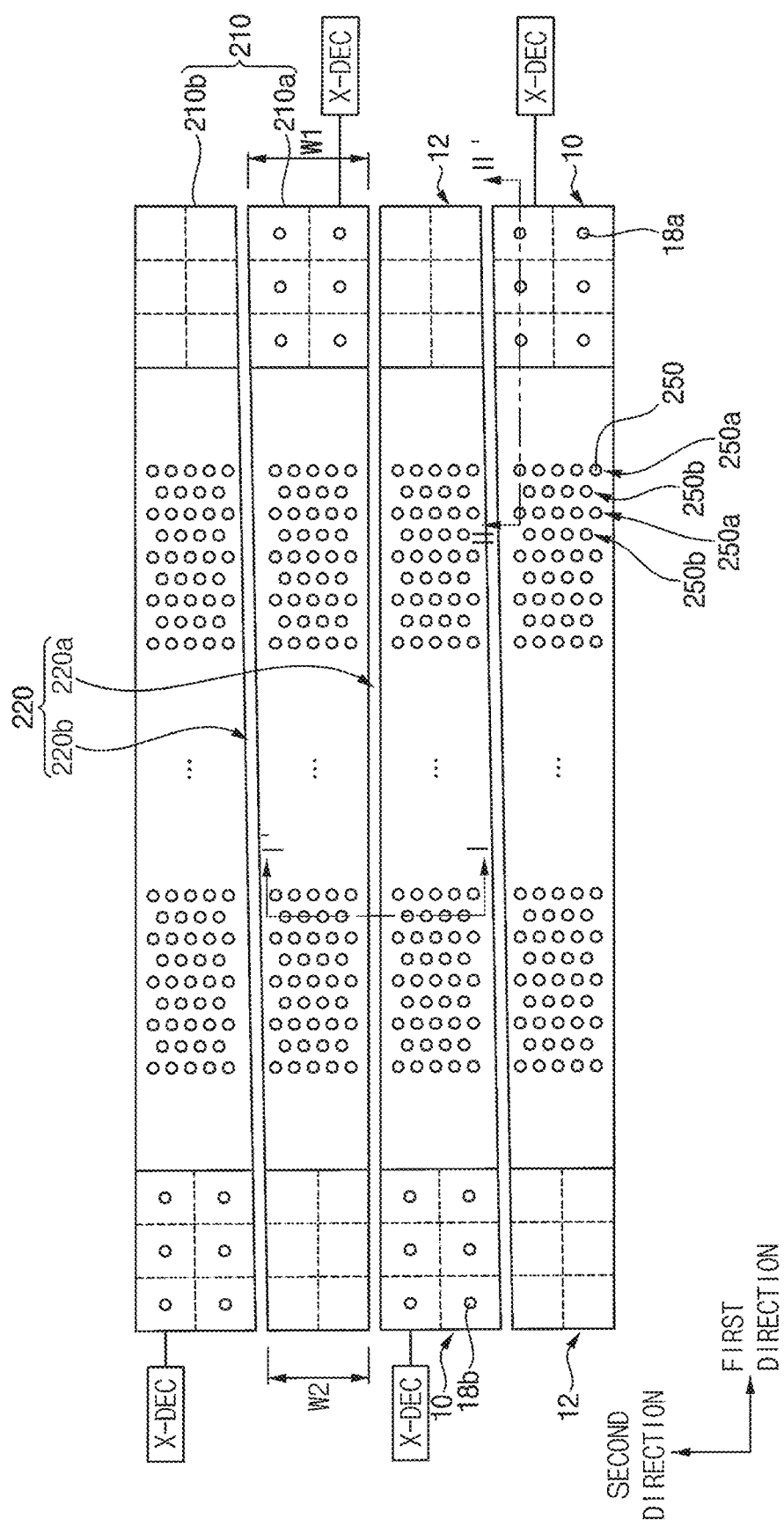
Figure 5A:
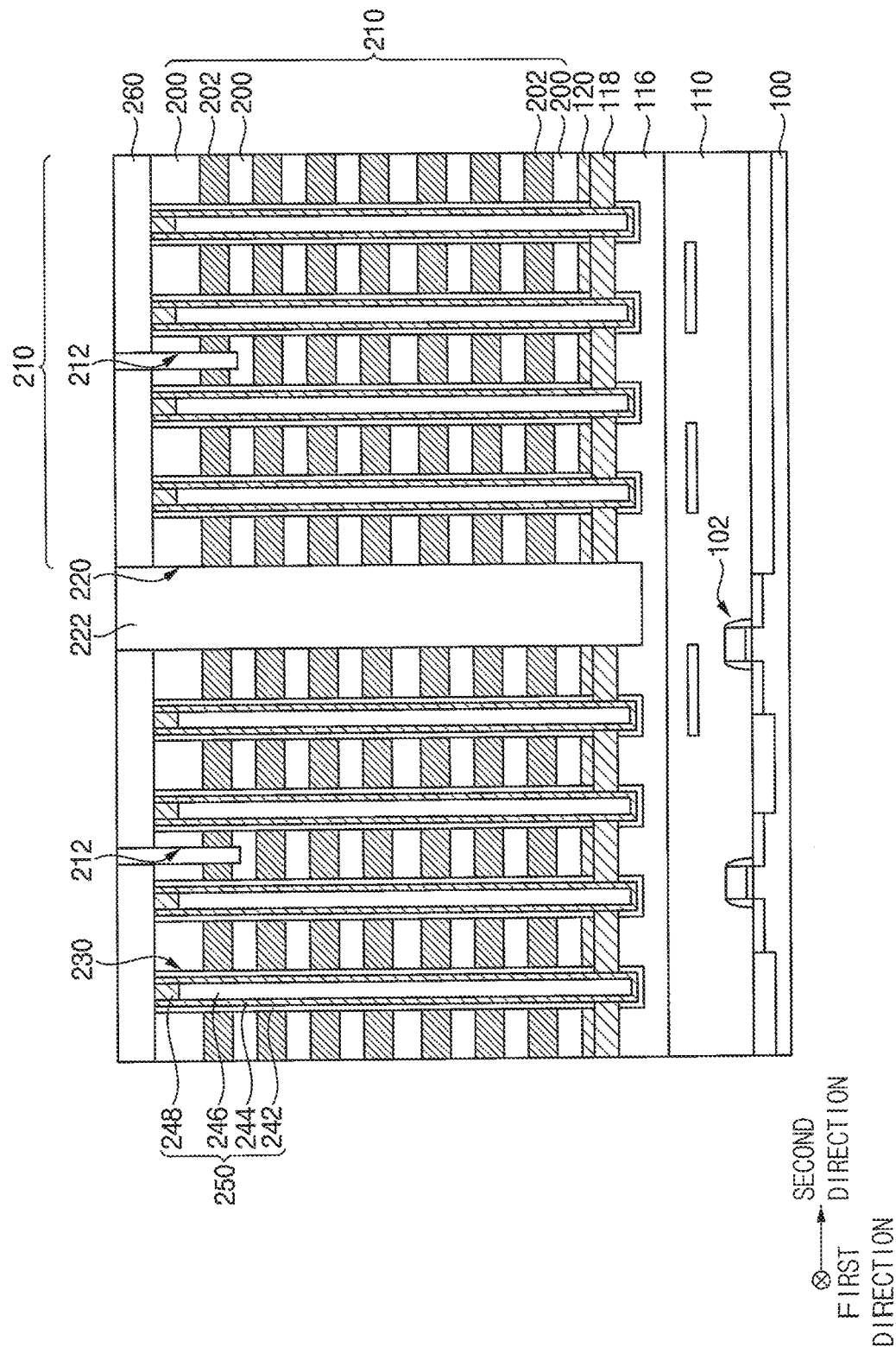
Figure 5B:
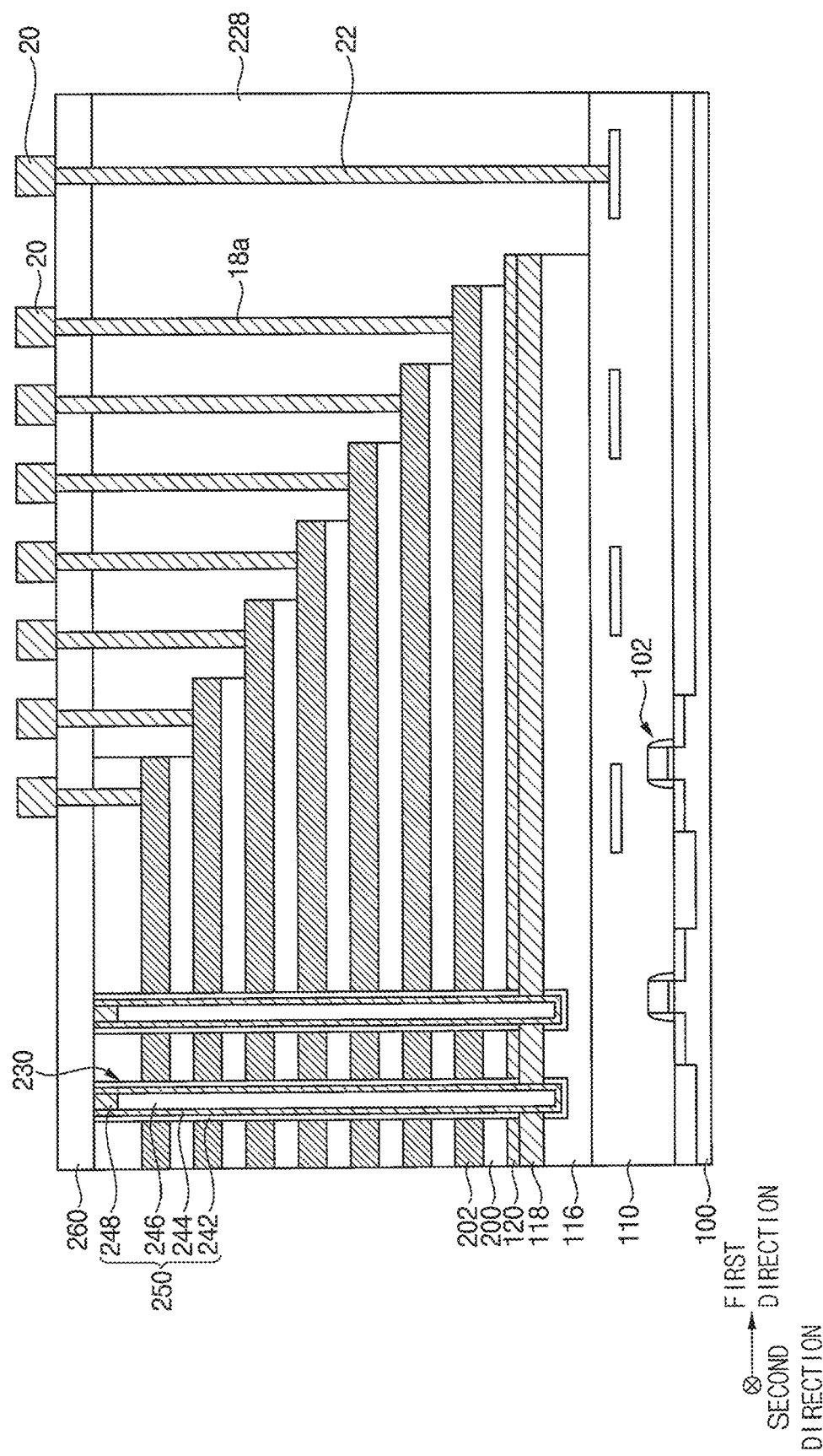
Figure 6:
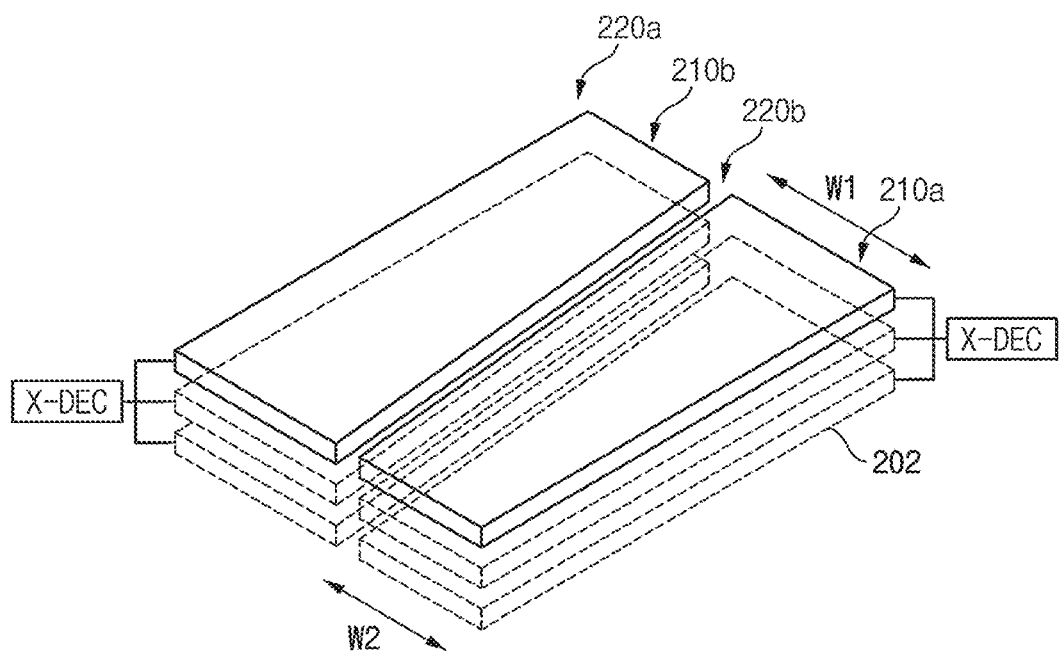
Figure 7:
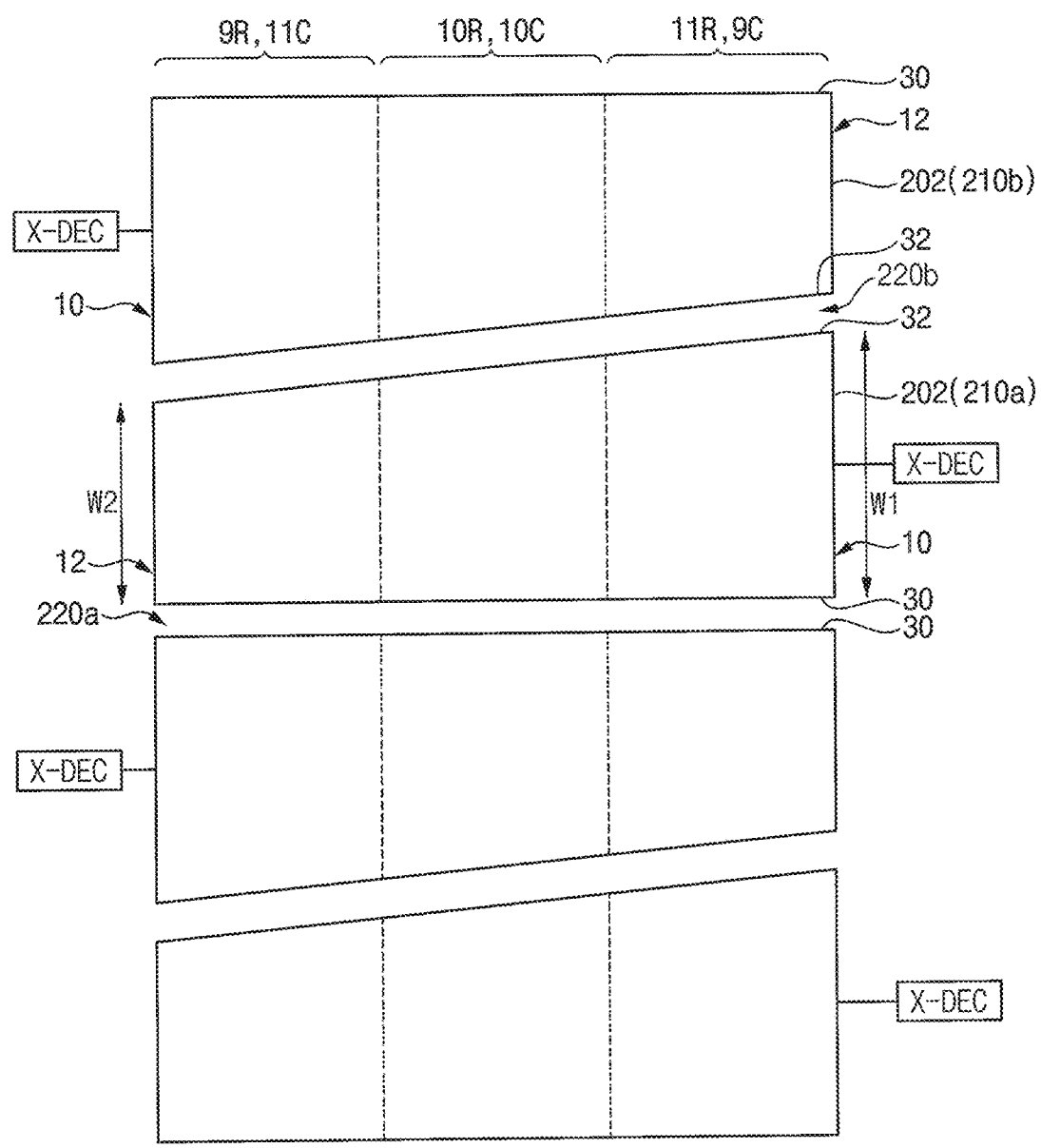

FIGS. 4, 5A, and 5B are a plan view and cross-sectional views illustrating a vertical semiconductor device in accordance with an example embodiment. FIG. 6 is a perspective view illustrating a portion of a conductive line structure in the vertical semiconductor device in accordance with an example embodiment. FIG. 7 is a plan view of a conductive line structure of the vertical semiconductor device in accordance with an example embodiment.

FIG. 5A is a cross-sectional view taken along line I-I' of FIG. 4, and FIG. 5B is a cross-sectional view taken along line II-II' of FIG. 4. The vertical semiconductor device may be a vertical NAND flash memory device.

Referring to FIGS. 4 to 7, the vertical semiconductor device may include a circuit pattern 102 on a substrate 100, memory cells electrically connected to the circuit pattern 102, and wirings electrically connecting the memory cells and the circuit pattern 102.

Hereinafter, the vertical semiconductor device may be described as having a Cell Over Peri (COP) structure. However, the vertical semiconductor device may not be limited to the COP structure.

The substrate 100 may be a semiconductor substrate, e.g., a silicon substrate, a germanium substrate, or a silicon-germanium substrate.

The circuit pattern 102 constituting a peripheral circuit may be formed on the substrate 100. A lower insulating interlayer 110 covering the circuit pattern 102 may be formed on the substrate 100. In some example embodiments, the circuit pattern 102 may constitute a page buffer circuit, a control circuit, a voltage generator, an address decoder, and a data input/output circuit.

A base pattern 116 may be formed on the lower insulating interlayer 110. In some example embodiments, the base pattern 116 may include, for example, polysilicon or single crystal silicon.

A channel connection pattern 118 and a support layer 120 may be formed on the base pattern 116. In some example embodiments, the channel connection pattern 118 and the support layer 120 may include, for example, polysilicon.

Conductive line structures 210 may be formed on the support layer 120.

The conductive line structure 210 may have a structure in which an insulation layer 200 and a conductive line 202 are alternately and repeatedly stacked. The conductive lines 202 may be spaced apart from each other in the vertical direction. The conductive lines 202 may extend in the first direction, and thus the conductive lines 202 may be longer in the first direction than in the second direction. In other words, the conductive lines 202 may elongate in the first direction.

As shown in FIG. 5B, both ends in the first direction of the conductive line structure 210 may have a step shape. An insulating interlayer 228 may be formed to cover step portions of the conductive line structure 210.

In some example embodiments, in the conductive line structure 210, the conductive lines 202 stacked in the vertical direction may have the same shape, except for both ends in the first direction of the conductive lines 202.

In some example embodiments, the conductive lines 202 may include a ground selection line (GSL), a string selection line (SSL) and word lines between the ground selection line and the string selection lines. The ground selection line may be disposed at a lower portion of the conductive line structure 210, and the string selection line may be disposed at an upper portion of the conductive line structure 210. One or a plurality of ground selection lines may be provided in the vertical direction, and one or a plurality of string selection lines may be provided in the vertical direction.

An upper trench 212 may be further included between the conductive lines 202 serving as the string selection line. The string selection line may be divided by the upper trench 212. The upper trench 212 may extend in the first direction.

The conductive line 202 may include a metal material. In some example embodiments, the conductive line 202 may include a metal pattern and a barrier metal pattern. The metal pattern may include, e.g., tungsten, copper, cobalt, aluminum, or the like, and the barrier metal pattern may include titanium, titanium nitride, tantalum, tantalum nitride, or the like. In some example embodiments, the conductive line 202 may include polysilicon.

In some example embodiments, a plurality of the conductive line structures 210 may be spaced apart from each other in the second direction. A first upper insulating interlayer 260 may be formed to cover the conductive line structure 210.

An opening 220 may be formed between the conductive line structures 210 in the second direction. In other words, the conductive line structures are separated by an opening 220 interposed therebetween. The opening 220 may extend from the first upper insulating interlayer 260 to the base pattern 116 in the vertical direction. An insulation pattern 222 may fill the opening 220.

The opening 220 may extend (e.g., elongate) in the first direction, and thus the opening 220 may be longer in the first direction than in the second direction. The opening 220 may serve as a word line cutting portion. A sidewall of the opening 220 may correspond to a sidewall of the conductive line structure 210. That is, the sidewall of the conductive line structure may be exposed by the opening 220.

A voltage from an address decoder X-DEC may directly supply into an edge portion in the first direction in each of the conductive lines 202 of the conductive line structure 210. In the conductive line structure 210, the edge portion in the first direction to which the voltage is supplied from the address decoder X-DEC may be referred to as a first end 10. An edge portion opposite to the first end 10 that is not directly connected to the address decoder X-DEC and is far from the address decoder X-DEC may be referred to as a second end 12. Similarly, in each of the conductive lines 202 of the conductive line structure 210, an edge portion in the first direction directly connected to the address decoder X-DEC to which a voltage is supplied from the address decoder X-DEC may be referred to as a first end 10. An edge portion opposite to the first end 10 may be referred to as a second end 12.

In the conductive line structure 210, a first width W1 in the second direction of the first end 10 and a second width W2 in the second direction of the second end 12 may be different from each other.

For example, in the conductive line structure 210, the first width W1 in the second direction of the first end 10 may be greater than a second width W2 in the second direction of the second end 12. Thus, in each of the conductive lines 202 included in the conductive line structure 210, the first width W1 in the second direction of the first end 10 may be greater than the second width W2 in the second direction of the second end 12.

In some example embodiments, the width in the second direction of the conductive line structure 210 may gradually decrease from the first end 10 to the second end 12. Accordingly, in a plan view, the conductive line structure 210 may not have a rectangular shape.

As shown in FIG. 7, in a plan view of the conductive line structure 210, the conductive line 202 may be divided into three regions to have equal lengths in the first direction. In this case, the first end 10 and a portion adjacent thereto may be referred to as a first region, and the second end 12 and a portion adjacent thereto may be referred to as a third region. A second region may be between the first region and the third region. An upper surface of the first region may be greater than an upper surface of the third region. Accordingly, a resistance at the portion adjacent to the first end 10 of the conductive line 202 may be lower than a resistance at the portion adjacent to the second end 12 of the conductive line 202. In the conductive line 202, the resistance may increase from the first end 10 to the second end 12.

Meanwhile, as shown in FIG. 6, a parasitic capacitance may be generated between the conductive lines 202 stacked in the vertical direction. Surfaces of conductive lines 202 facing vertically in the first region may be greater than surfaces of the conductive lines 202 facing vertically in the third region. Thus, a parasitic capacitance in the first region may be greater than a parasitic capacitance in the third region. In the conductive lines 202, the parasitic capacitance may decrease from the first end 10 to the second end 12.

As the resistance in the first region decreases, the RC delay may be reduced. Further, as the parasitic capacitance in the second region decreases, the RC delay may be reduced. Therefore, the RC delay in each of conductive lines 202 may be reduced.

Signal from the address decoder X-DEC may be rapidly transferred to each of the conductive lines 202, so that a charging time of each of conductive lines 202 to be charged to a target voltage desired for a device operation may be greatly reduced.

Channel holes 230 may pass through the conductive line structure 210, the support layer 120, and the channel connection pattern 118, and the channel holes may expose an upper portion of the base pattern 116.

A channel structure 250 may formed in the channel hole 230. The channel structure 250 may include a charge storage structure 242, a channel 244, a filling insulation pattern 246, and a capping pattern 248.

For example, the channel 244 may extend to the upper portion of the base pattern 116 and may have a cup shape. The charge storage structure 242 may surround an outer wall of the channel 244. The charge storage structure 242 may include a tunnel insulation pattern, a charge storage pattern, and a first blocking layer pattern sequentially stacked from an outer wall of the channel 244.

The channel connection pattern 118 may directly contact a lower portion of the channel 244. Therefore, the channels 244 in the channel holes 230 may be electrically connected to each other by the channel connection pattern 118. The charge storage structure 242 may be above and below the channel connection pattern 118. Upper and lower portions of the charge storage structure 242 may cut at the channel connection pattern 118.

The channel 244 may include, for example, polysilicon. The tunnel insulation pattern may include, for example, silicon oxide. The charge storage pattern may include, for example, silicon nitride. The first blocking layer pattern may include, for example, silicon oxide.

The filling insulation pattern 246 may have a pillar shape to fill an inner space formed by the channel 244. The capping pattern 248 may be formed on the filling insulation pattern 246 and the channel 244. The capping pattern 248 may include polysilicon. A lower surface of the capping pattern 248 may be higher than an upper surface of an uppermost conductive line.

The channel structures 250 may pass through the conductive line structure 210. The channel structures 250 may be spaced apart from each other in the second direction, and may be arranged in the second direction.

In some example embodiments, the channel structures 250 disposed in a first row may constitute a first channel structure group 250a, and the channel structures 250 disposed in a second row may constitute a second channel structure group 250b. The channel structures included in the first channel structure group 250a and the channel structures included in the second channel structure group 250b may be disposed not in parallel in the first direction. In addition, the first channel structure group 250a and the second channel structure group 250b may be alternately and repeatedly arranged in the first direction. Thus, the channel structures 250 may be disposed in a zigzag pattern in the first direction.

Two conductive line structures 210 adjacent to each other in the second direction are referred to as a first conductive line structure 210a and a second conductive line structure 210b, respectively.

The first conductive line structure 210a and the second conductive line structure 210b may be alternately and repeatedly disposed in the second direction to be spaced apart from each other. The first conductive line structures may constitute an odd-numbered cell block, and the second conductive line structures may constitute an even-numbered cell block.

Referring to FIG. 7, in the plan view, each of the first and second conductive line structures 210a and 210b may have a first side 30 and a second side 32. The first sides 30 of the first and second conductive line structures 210a and 210b may face each other in the second direction. The first sides 30 may correspond to first sidewalls of the first and second conductive line structures 210a and 210b, and the second side 32 may correspond to second sidewalls of the first and second conductive line structures 210a and 210b. In the plan view, at least one of the first side 30 or the second side 32 may not be parallel to the first direction. In other words, at least one of the first side 30 or the second side 32 may be inclined with respect to the first direction in the plan view.

In some example embodiments, in the plan view, in each of the first and second conductive line structures 210a and 210b, the first side 30 may have a line shape parallel to the first direction, and the second side 32 may extend so as not to be parallel to the first direction (e.g., may extend to be inclined with respect to the first direction). The second side 32 may have a diagonal shape having an inclination with the first direction. That is, in the plan view, each of the first and second conductive line structures 210a and 210b may have a trapezoidal shape with one side having the diagonal shape. In the plan view, the first sides 30 of the first and second conductive line structures 210a and 210b may face each other, and the second sides 32 of the first and second conductive line structures 210a and 210b may face each other.

Thus, a first opening 220a may be between the first sides 30 of the first and second conductive line structures 210a and 210b, and the first opening 220a may extend in parallel in the first direction. A second opening 220b may be between second sides 32 of the first and second conductive line structures 210a and 210b, and the second opening 220b may extend (e.g., elongate) in the diagonal direction having an inclination with the first direction.

In some example embodiments, the width in the second direction of each of the first and second conductive line structures 210a and 210b may gradually decrease from the first end 10 to the second end 12.

That is, a right edge of the first conductive line structure 210a may be the first end 10 and a left edge of the first conductive line structure 210a may be the second end 12. A left edge of the second conductive line structure 210b may be the first end 10 and a right edge of the second conductive line structure 210b may be the second end 12.

Each of the conductive lines 202 included in the first conductive line structure 210a may be connected to the address decoder X-DEC at a portion adjacent to the first end 10 thereof. Each of the conductive lines 202 included in the second conductive line structure 210b may be connected to the address decoder X-DEC at a portion adjacent to the first end 10 thereof. In some example embodiments, the address decoder X-DEC may be connected to the first end 10 of each of the conductive lines 202 in the first conductive line structure 210a. In some example embodiments, the address decoder X-DEC may be connected to the first end 10 of the conductive lines 202 in the second conductive line structure 210b.

Contact plugs 18a (refer to FIG. 4) and wirings for electrically connecting to the address decoder X-DEC may be formed at the first end 10 of each of the conductive lines 202 in the first conductive line structure 210a. For example, as shown in FIG. 5B, a first contact plug 18a may be formed on an upper surface adjacent the first end of each of the conductive lines 202 in the first conductive line structure 210a, and the first contact plug 18a may pass through the first upper insulating interlayer 260 and the insulating interlayer 228. A wiring for electrically connecting the first contact plug 18a and a circuit pattern 102 corresponding to the address decoder X-DEC may be formed. For example, the wiring may include a conductive pattern 20 and a through via 22.

In addition, contact plugs 18b (refer to FIG. 4) and a wiring for electrically connecting to the address decoder X-DEC may be formed at the first end 10 of each of the conductive lines 202 in the second conductive line structure 210b.

As described above, the contact plugs and the wirings may be connected to the first end 10 of the conductive lines. The first end 10 of the conductive lines may be electrically connected to the circuit patterns 102 corresponding to the address decoder X-DEC through the contact plugs and the wirings.

In the plan view, the first conductive line structure 210a and the second conductive line structure 210b adjacent to each other may have trapezoidal shapes, respectively. In the first and second conductive line structures 210a and 210b, each of address decoders may be connected to the first end 10 having a wide width, so that RC delay of the conductive lines included in the first and second conductive line structures 210a and 210b may be decreased.

Hereinafter, the RC delay of the first and second conductive line structures shown in FIG. 7 and the first and second conductive line structures having a rectangular shape in the plan view are compared with some example embodiments.

Figure 8:
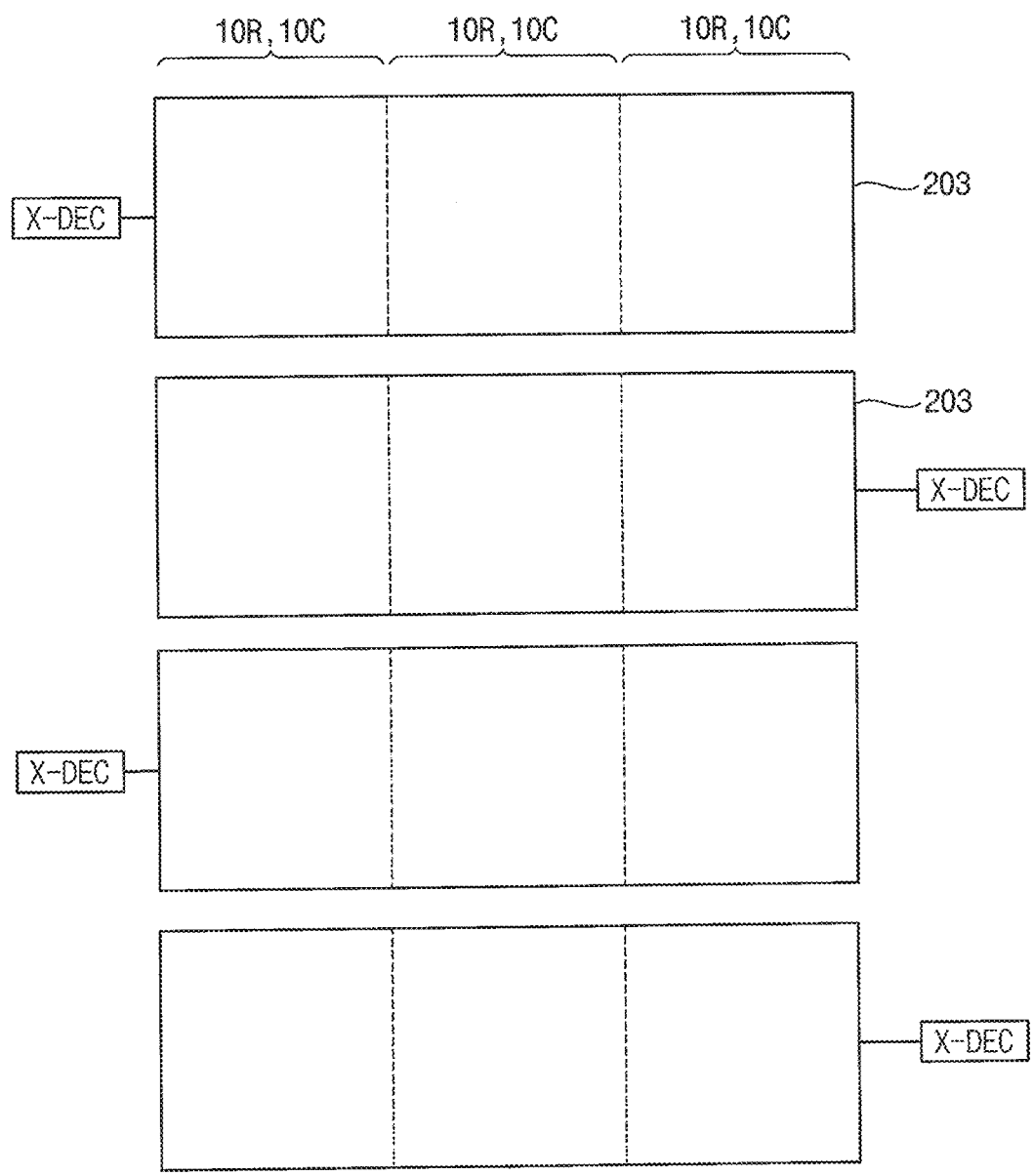

FIG. 8 is a plan view of a conductive line structure of a vertical semiconductor device for comparison with the conductive line structure of the vertical semiconductor device in accordance with an example embodiment.

In FIGS. 7 and 8, channel structures are omitted to simplify FIGS. 7 and 8. In FIGS. 7 and 8, a conductive line structure groups may include one first conductive line structure and one second conductive line structure, and areas of upper surfaces of conductive line structure groups may be equal to each other.

In FIGS. 7 and 8, the conductive line 202 included in the conductive line structure is divided into three regions to have equal lengths in the first direction, and the three regions may be a first region, a second region, and a second region sequentially from the first end of the conductive line structure.

In FIG. 7, the resistance and the parasitic capacitance of each region of the conductive line 202 included in the conductive line structure may be 9R and 11C in the first region, 10R, 10C in the second region, and 11R and 9C in the third region.

In the plan view, as the conductive line structure shown in FIG. 8 has a rectangular shape, the resistance and the parasitic capacitance of each region of the conductive line 203 shown in FIG. 8 may be the same. In FIG. 8, the resistance and the parasitic capacitance of each region of the conductive line 203 may be 10R and 10C in each of the first to third regions.

In FIG. 7, the RC delay of the conductive line included in the conductive line structure may be calculated as 99RC+190RC+270RC=559RC.

Meanwhile, in FIG. 8, the RC delay of the conductive line included in the conductive line structure may be calculated as 100RC+200RC+300RC=600RC.

As such, in each conductive line 202 of the vertical semiconductor device in accordance with some example embodiments, the RC delay may be reduced as the resistance is reduced at the first end 10 adjacent to the address decoder X-DEC. Further, the RC delay may be reduced as the parasitic capacitance is reduced at the second end 12. Thus, the RC delay of each of conductive lines 202 may be decreased.

Hereinafter, various example embodiments in which the width in the second direction of the conductive line structure is gradually decreased from the first end 10 to the second end 12 may be described.

Figure 9:
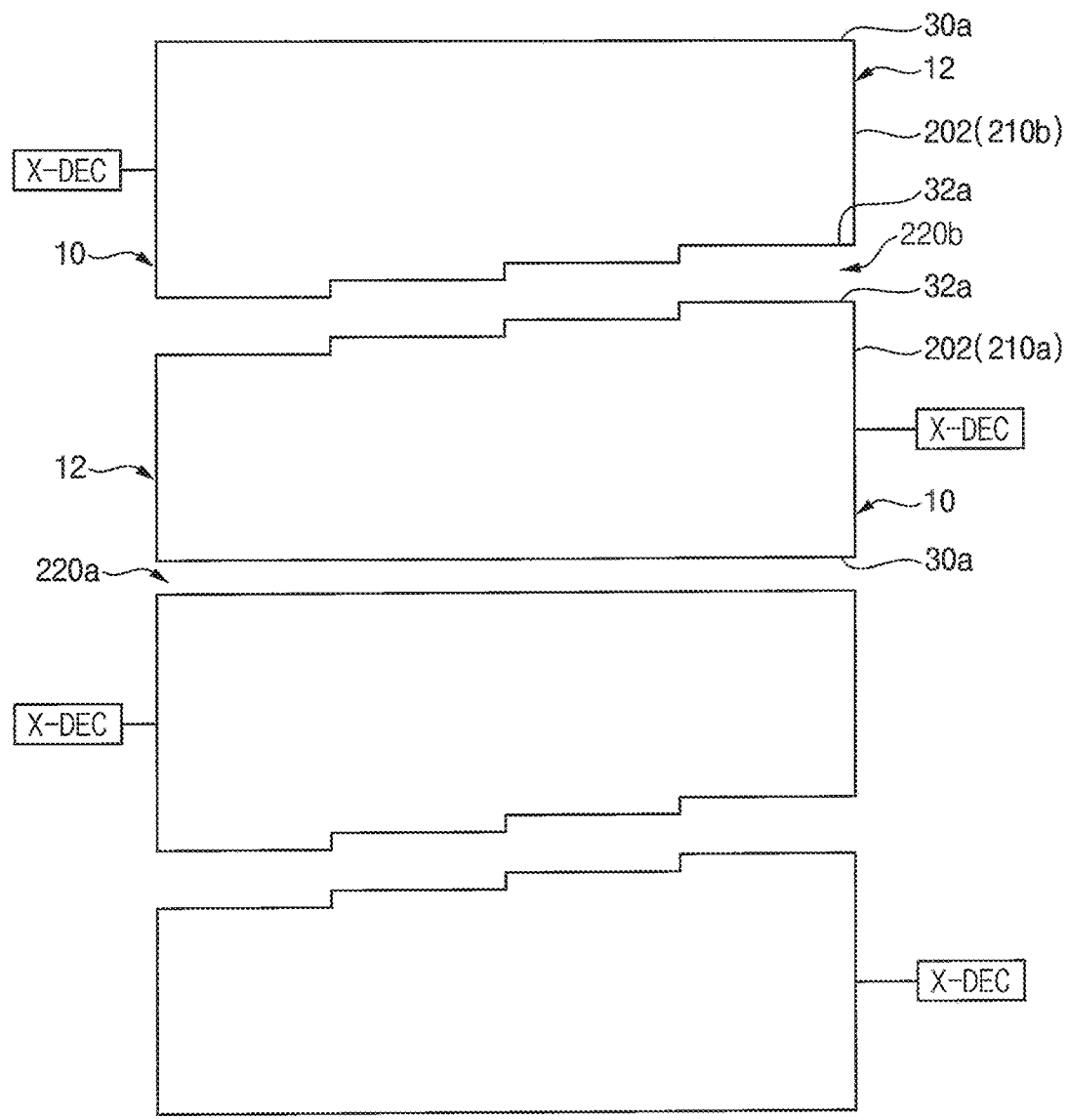

FIG. 9 is a plan view of a conductive line structure of a vertical semiconductor device in accordance with an example embodiment.

FIG. 9 illustrates conductive lines included in the conductive line structure, and channel structures are omitted to simplify FIG. 9.

Referring to FIG. 9, each of the first and second conductive line structures 210a and 210b may have a first portion 30a and a second portion 32a. The first portions 30a may correspond to opposite first sidewalls of the first and second conductive line structures 210a and 210b, and the second portions 32a may correspond to opposite second sidewalls of the first and second conductive line structures 210a and 210b.

In a plan view, in the first and second conductive line structures 210a and 210b, the first portion 30a may have a line shape parallel to the first direction, and the second portion 32a may have a step shape. The first portions 30a of the first and second conductive line structures 210a and 210b may face each other in the second direction. The second portions 32a of the first and second conductive line structures 210a and 210b may face each other in the second direction.

For example, the second portion 32a in the first conductive line structure 210a may have the step shape in which the width in the second direction of the first conductive line structure 210a increases from left to right. Further, the second portion 32a in the second conductive line structure 210b may have the step shape in which the width in the second direction of the second conductive line structure 210b decreases from left to right.

In the plan view, the first opening 220a between the first portions 30a of the first and second conductive line structures 210a and 210b may extend in parallel in the first direction. The second opening 220b between second portions 32a of the first and second conductive line structures 210a and 210b may extend to have stepped sidewalls. That is, the sidewalls of the second opening 220b may include bent portions.

Here, a right edge of the first conductive line structure 210a may be the first end 10 and a left edge of the first conductive line structure 210a may be the second end 12. A left edge of the second conductive line structure 210b may be the first end 10 and a right edge of the second conductive line may be the second end 12. Each of the conductive lines 202 included in the first conductive line structure 210a may be connected to the address decoder X-DEC at a portion adjacent to the first end 10 thereof. Each of the conductive lines 202 included in the second conductive line structure 210b may be connected to the address decoder X-DEC at a portion adjacent to the first end 10 thereof.

Figure 10:
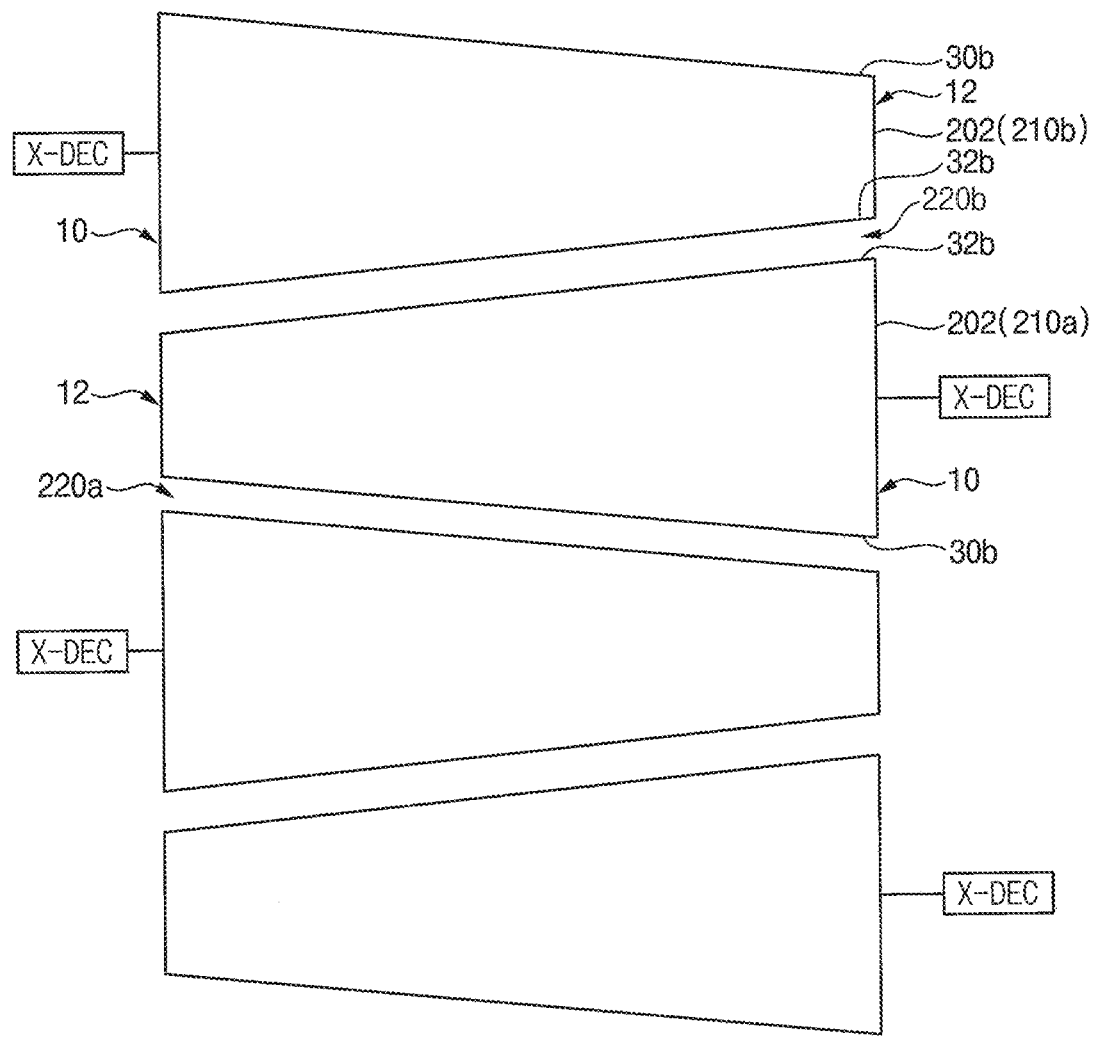

FIG. 10 is a plan view of a conductive line structure of a vertical semiconductor device in accordance with an example embodiment.

FIG. 10 illustrates conductive lines included in the conductive line structure, and channel structures are omitted to simplify FIG. 10.

Referring to FIG. 10, each of the first and second conductive line structures 210a and 210b may have a first side 30b and a second side 32b. The first sides 30b of the first and second conductive line structures 210a and 210b may face each other in the second direction. The first sides 30b may correspond to opposite first sidewalls of the first and second conductive line structures 210a and 210b, and the second side 32b may correspond to opposite second sidewalls of the first and second conductive line structures 210a and 210b.

In each of the first and second conductive line structures 210a and 210b, the first side 30b and the second side 32b may not be parallel to (e.g., may be inclined with respect to) the first direction. Each of the first side 30b and the second side 32b may have a diagonal shape having an inclination with the first direction.

For example, in the first conductive line structure 210a, each of the first and second sides 30b and 32b may extend in a diagonal direction so that a width in the second direction of the first conductive line structure 210a may increase from left to right. Also, in the second conductive line structure 210b, the first and second sides 30b and 32b may extend in a diagonal direction so that a width in the second direction may decrease from left to right.

In the plan view, each of the first and second conductive line structures 210a and 210b may have an isosceles trapezoidal shape so that each of both sides of the first and second conductive line structures 210a and 210b may have a diagonal shape.

Thus, the first opening 220a may be between the first sides 30b of the first and second conductive line structures 210a and 210b, and the first opening 220a may extend in a diagonal direction having an inclination with the first direction. Also, the second opening 220b may be between the second sides 32b of first and second conductive line structures 210a and 210b, and the second opening 220a may extend in a diagonal direction having an inclination with the first direction.

A right edge of the first conductive line structure 210a may be the first end 10, and a left edge of the first conductive line structure 210a may be the second end 12. A left edge of the second conductive line structure 210b may be the first end 10, and a right edge of the second conductive line structure 210b may be the second end 12. Each of the conductive lines 202 included in the first conductive line structure 210a may be connected to the address decoder X-DEC at a portion adjacent to the first end 10 thereof. Each of the conductive lines 202 included in the second conductive line structure 210b may be connected to the address decoder X-DEC at a portion adjacent to the first end 10 thereof.

Figure 11:
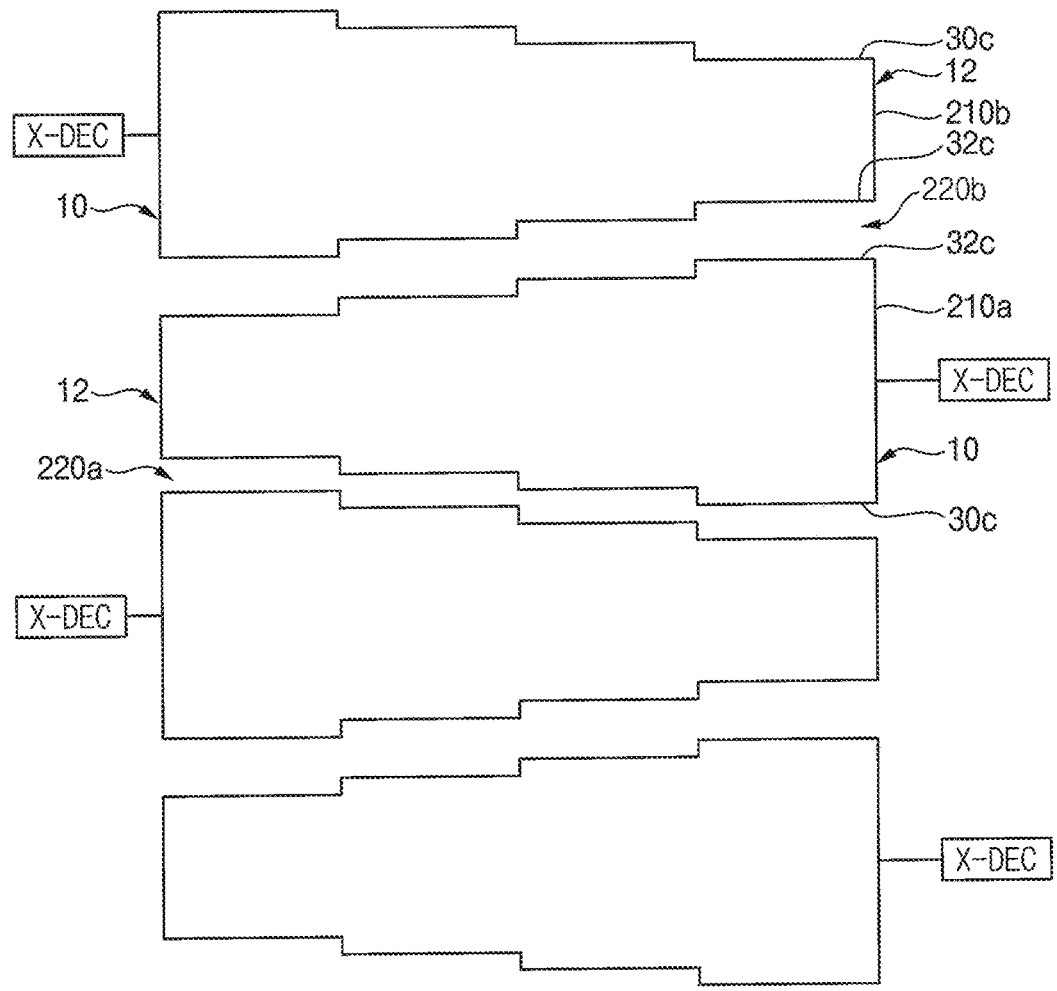

FIG. 11 is a plan view of a vertical semiconductor device in accordance with an example embodiment.

FIG. 11 illustrates conductive lines included in the conductive line structure, and channel structures are omitted to simplify FIG. 11.

Referring to FIG. 11, each of the first and second conductive line structures 210a and 210b may have a first portion 30c and a second portion 32c. The first portions 30c of the first and second conductive line structures 210a and 210b may face each other in the second direction. The first portions 30c may correspond to opposite first sidewalls of the first and second conductive line structures 210a and 210b, and the second portions 32c may correspond to opposite second sidewalls of the first and second conductive line structures 210a and 210b.

In a plan view, the first and second portions 30c and 32c of each of the first and second conductive line structures 210a and 210b may have step shapes.

For example, in the first conductive line structure 210a, the steps of the first portion 30c and the second portion 32c may be formed such that a width in the second direction increases from left to right. In the second conductive line structure 210b, the steps of the first portion 30c and the second portion 32c may be formed such that a width in the second direction decreases from left to right.

In the plan view, a first opening 220a may be between the first portions 30c of first and second conductive line structures 210a and 210b, the first opening 220a may have a step shape. The second opening 220b may be between the second portions 32c of the first and second conductive line structures 210a and 210b, and the second opening 220b may have a step shape. That is, sidewalls of the first opening 220a and the second opening 220b may include bent portions.

Here, a right edge of the first conductive line structure 210a may be the first end 10 and a left edge of the first conductive line structure 210a may be the second end 12. A left edge of the second conductive line structure 210b may be the first end 10 and a right edge of the second conductive line structure 210b may be the second end 12. Each of the conductive lines 202 included in the first conductive line structure 210a may be connected to the address decoder X-DEC at portions adjacent to the first end 10 thereof. Each of the conductive lines 202 included in the second conductive line structure 210b may be connected to the address decoder X-DEC at portions adjacent to the first end 10 thereof.

Figure 12:
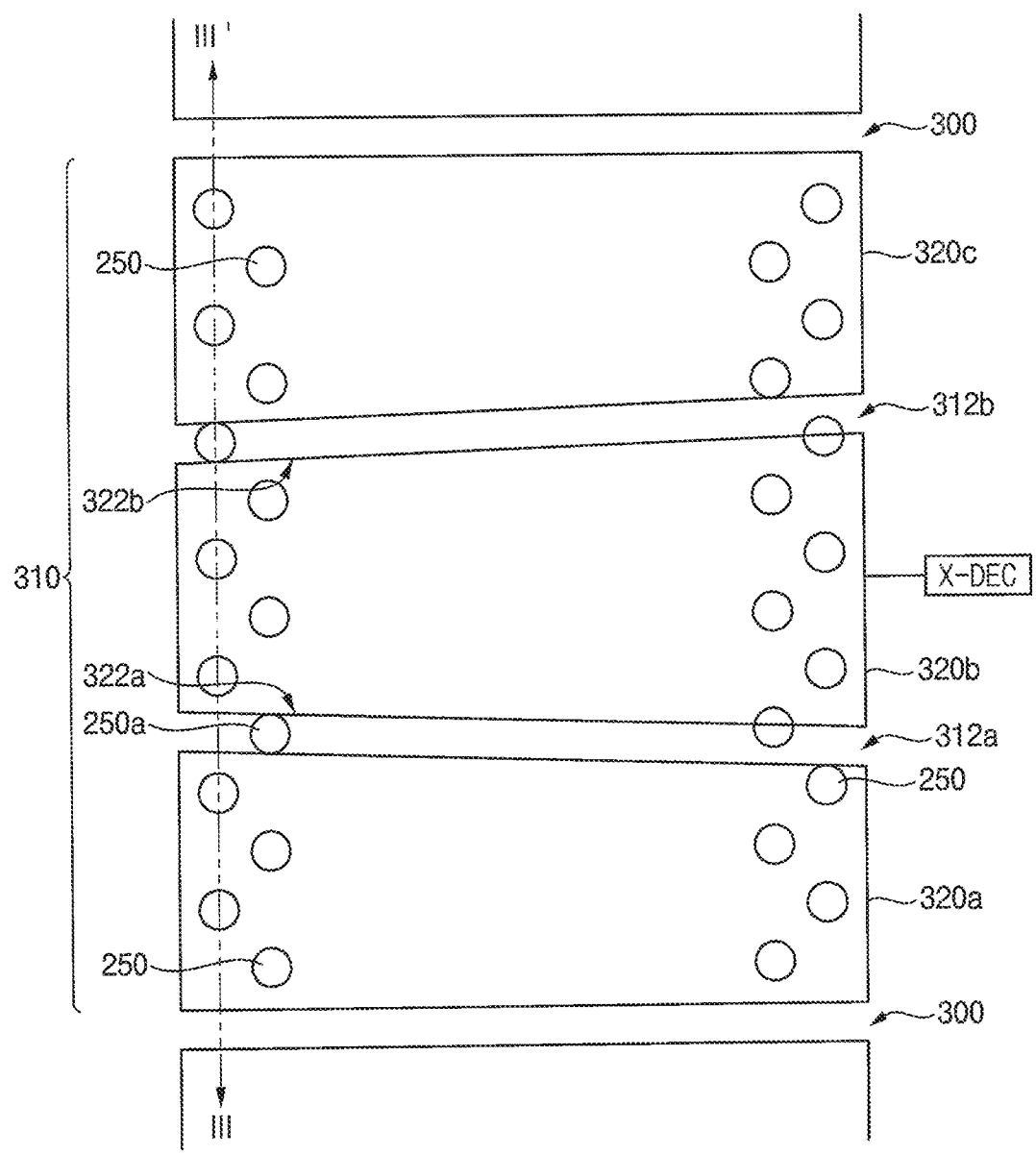
Figure 13:
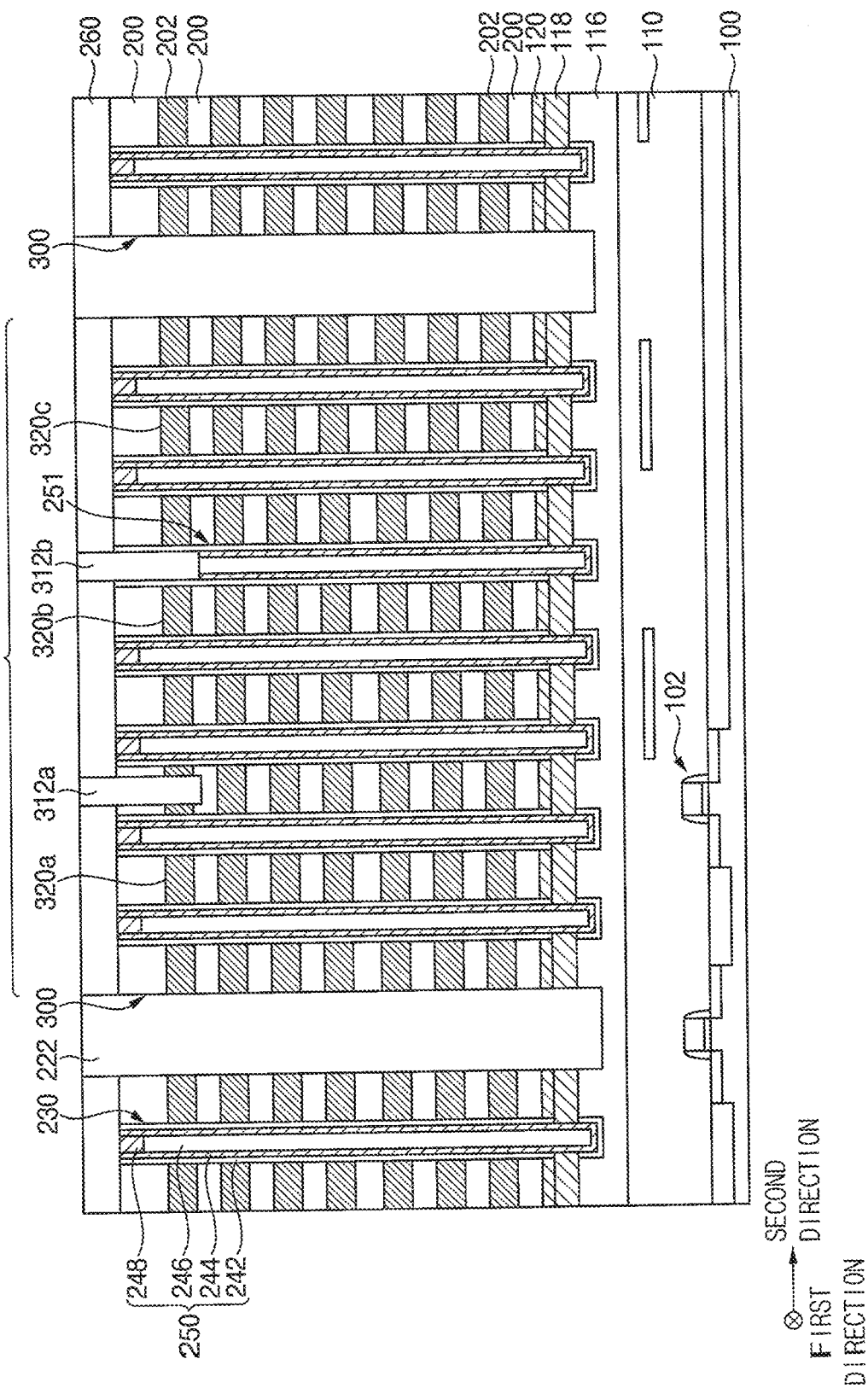

FIGS. 12 and 13 are a plan view and a cross-sectional view illustrating a vertical semiconductor device in accordance with an example embodiment.

The vertical semiconductor device may be a vertical NAND flash memory device. FIG. 12 shows string select lines and channel structures at a top portion of a conductive line structure. FIG. 13 is a cross-sectional view taken along line III-III' of FIG. 12.

The vertical semiconductor device shown in FIGS. 12 and 13 may be the same as or substantially similar to the vertical semiconductor device described with reference to FIGS. 4, 5A and 5B, except for the shapes of openings serving as an upper trench for SSL cutting and a trench for word line cutting.

Referring to FIGS. 12 and 13, a conductive line structure 310 may have a structure in which the insulation layer 200 and the conductive line 202 are alternately and repeatedly stacked.

In some example embodiments, the conductive lines 202 may include a ground selection line (GSL), a string selection line (SSL) and word lines between the ground selection lines and the string selection lines. The ground selection line may be disposed at a lower portion of the conductive line structure 310, and the string selection line may be disposed at an upper portion of the conductive line structure 310. One or a plurality of ground selection lines may be provided in the vertical direction, and one or a plurality of string selection lines may be provided in the vertical direction.

In some example embodiments, a plurality of the conductive line structures 310 may be spaced apart from each other in the second direction. An opening 300 serving as a word line cutting portion may be formed between the conductive line structures 310 spaced apart from each other in the second direction. The opening 300 may extend in the first direction. That is, in a plan view, a sidewall of the opening 300 may have a line shape parallel to the first direction. A sidewall of the opening 300 may correspond to a sidewall of the conductive line structure 310. Both sidewalls of the conductive line structure 310 may have line shapes parallel to the first direction.

A plurality of string selection lines 320a, 320b, and 320c may be included in one conductive line structure 310, and the string selection lines 320a, 320b, and 320c may be spaced apart from each other in the second direction. Upper trenches 312a and 312b may be formed between the string selection lines 320a, 320b, and 320c, and the upper trenches 312a and 312b may serve as the SSL cutting portion. Some of the upper trenches 312a and 312b may be disposed on the channel structures. The channel structure disposed under the upper trench 312a may serve as a dummy channel structure 251.

The upper trenches 312a and 312b may be longer in the first direction than in the second direction. In other words, the upper trenches 312a and 312b may elongate in the first direction. In the plan view, sidewalls of the upper trenches 312a and 312b may extend in a diagonal direction having an inclination with the first direction. In other words, the upper 312a and 312b may extend/elongate to be not parallel with the first direction.

In some example embodiments, two upper trenches may be formed in one conductive line structure 310, which may be referred to as first and second upper trenches 312a and 312b, respectively. In this case, three string selection lines 320a, 320b, and 320c may be included in the conductive line structure 310, which may be referred to as first, second and third string selection lines 320a, 320b, and 320c, respectively.

The second string selection line 320b may be disposed between the first and third string selection lines 320a and 320c in the second direction.

In this case, a sidewall of each of the first and third string selection lines 320a and 320c may correspond to a sidewall of the opening 300. The sidewall of each of the first and third string selection lines 320a and 320c may correspond to a sidewall of the conductive line structure 310. In the sidewall of each of the first and third string selection lines 320a and 320c corresponding to sidewalls of the opening 300, signal transmission interference due to the channel structures 250 may be small. Thus, the signal may be transmitted relatively quickly through the first and third string selection lines 320a and 320c. However, since sidewalls of the second string selection line 320b may not correspond to the sidewalls of the opening 300, the signal transmission in the second string selection line 320b may be more interfered by the channel structure 250. A signal transmission interference in the second string selection line 320b may be greater than the signal transmission interference in the first and third string selection lines 320a and 320c. Thus, the RC delay of the second string selection line 320b may be greater than the RC delay of each of the first and third string selection lines 320a and 320c.

In the plan view, the second string selection line 320b may include first and second sides 322a and 322b facing each other in the second direction. The first and second sides may correspond to first and second sidewalls of the second string selection line 320b, respectively. In the plan view, the first side 322a may have a diagonal shape having an inclination with the first direction. The second side 322b may have a diagonal shape having an inclination with the first direction. In this case, each of the first side 322a and the second side 322b may extend such that a width in the second direction of the second string selection line 320b decreases from the first end to the second end of the second string selection line 320b. That is, in the plan view, the second string selection line 320b may have an isosceles trapezoidal shape.

In the conductive line structure 310, an address decoder X-DEC may be connected to the first end of the second string selection line 320b. That is, the address decoder X-DEC may be connected to a right end of the conductive line structure 310.

The first upper trench 312a between the first and second string selection lines 320a and 320b may extend in a diagonal direction having an inclination with the first direction. The second upper trench 312b between the second and third string selection lines 320b and 320c may extend in a diagonal direction having an inclination with the first direction.

Thus, a resistance at the first end of the second string selection line 320b may be decreased, and a parasitic capacitance at the second end of the second string selection line 320b may be decreased. The RC delay of the second string selection line 320b may be reduced. Therefore, defects due to the RC delay of the second string selection line 320b may be reduced.

As such, in the plan view, at least one of the conductive lines (e.g., string selection lines) included in the conductive line structure 310 may have a non-rectangular shape.

Hereinafter, various embodiments in which at least one of the conductive lines included in the conductive line structure may have a non-rectangular shape in the plan view may be described.

Figure 14:
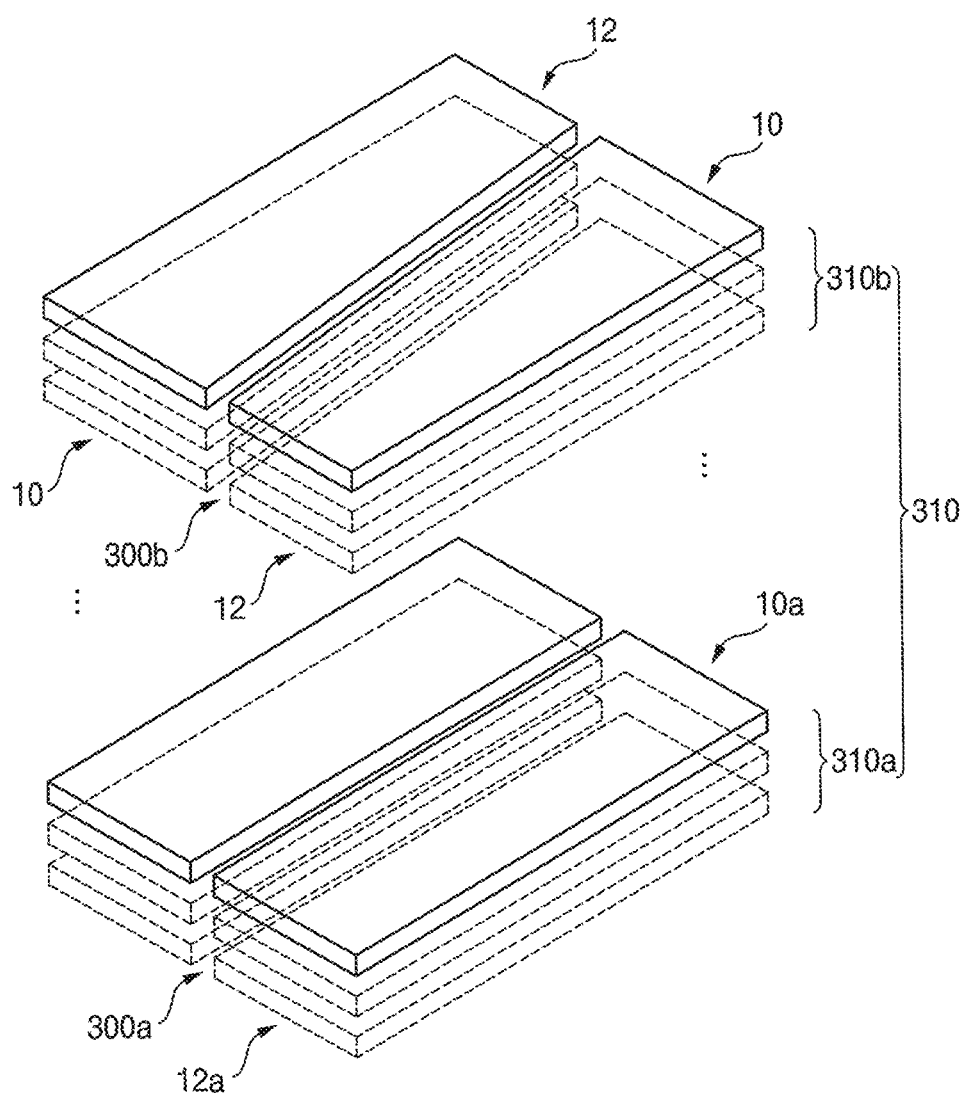
Figure 15:
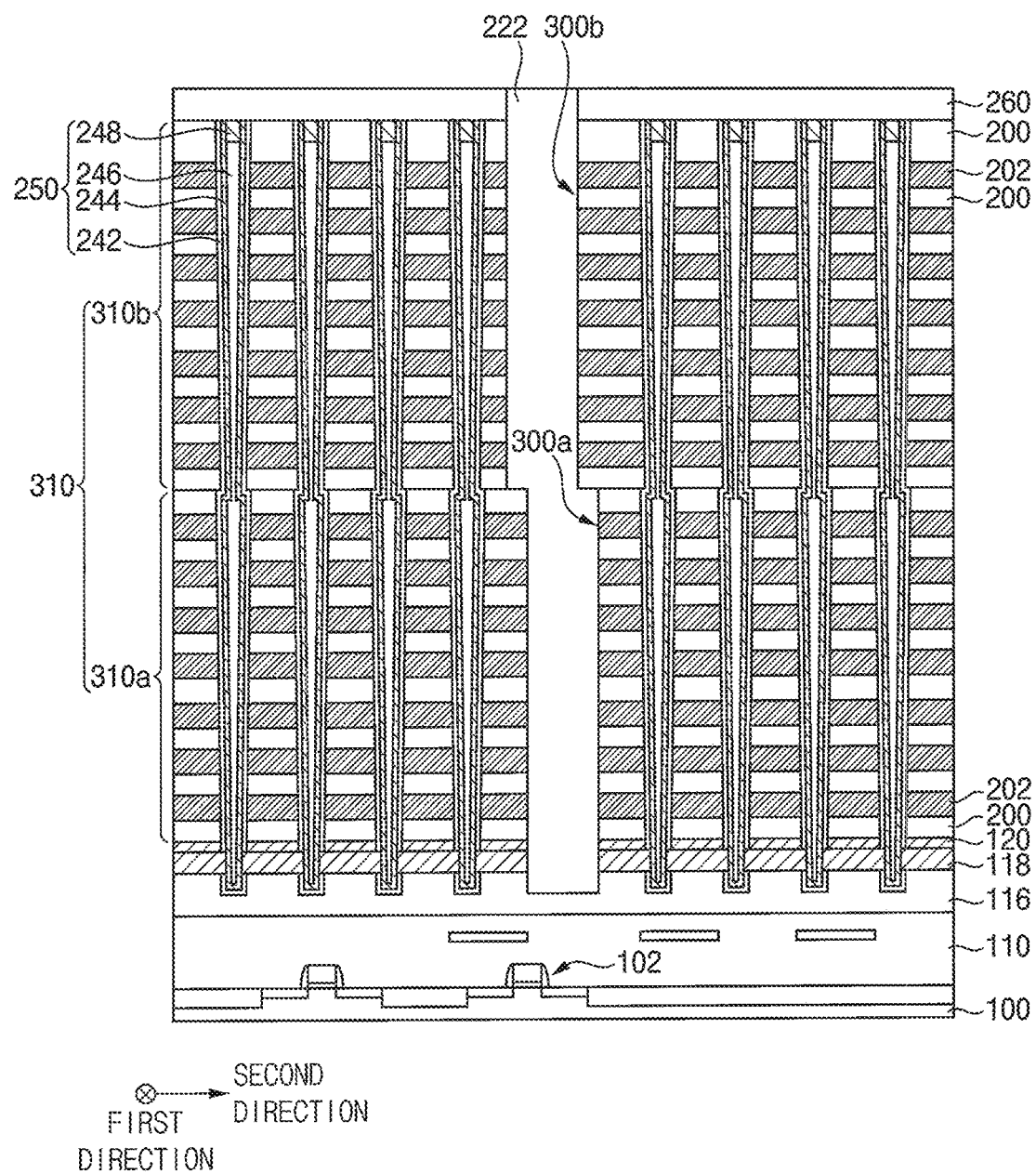

FIGS. 14 and 15 are a perspective view and a cross-sectional view illustrating a vertical semiconductor device in accordance with an example embodiment.

FIG. 14 is a perspective view illustrating a portion of conductive lines included in the conductive line structure, and channel structures are omitted to simplify FIG. 14.

The vertical semiconductor device shown in FIGS. 14 and 15 may be the same as or substantially similar to the vertical semiconductor device described with reference to FIGS. 4, 5A, and 5B, except for a shape of an opening for word line cutting.

Referring to FIGS. 14 and 15, a conductive line structure 310 may have a structure in which the insulation layer 200 and the conductive line 202 are alternately and repeatedly stacked.

In some example embodiments, the conductive line structure 310 may include a lower conductive line structure 310a and an upper conductive line structure 310b stacked. That is, the upper conductive line structure 310b may be formed on the lower conductive line structure 310a. The conductive line 202 of the lower conductive line structure 310a may include a ground selection line (GSL) and first word lines. The conductive line 202 of the upper conductive line structure 310b may include second word lines and a string selection line (SSL).

In a plan view, the lower conductive line structure 310a may have a rectangular shape. In the plan view, the upper conductive line structure 310b may have a non-rectangular shape.

In some example embodiments, a plurality of the conductive line structures 310 may be spaced apart from each other in the second direction. An opening for a word line cutting may be formed between the conductive line structures 310 spaced apart from each other in the second direction. In one conductive line structure, an opening corresponding to one sidewall of the conductive line structure may be referred to as a first opening, and an opening corresponding to the other sidewall of the conductive line structure may be referred to as a second opening.

For example, the first opening may include a lower opening 300a between the lower conductive line structures 310a and an upper opening 300b between the upper conductive line structures 310b. The upper and lower openings 300b and 300a may communicate with each other to provide a single first opening. The upper and lower openings 300b and 300a may have different shapes. For example, the lower opening 300a may extend in parallel with the first direction. That is, in the plan view, a sidewall of the lower opening 300a may have a line shape parallel to the first direction. The sidewall of the lower opening 300a may correspond to a sidewall of the lower conductive line structure 310a. The upper opening 300b may extend not parallel to the first direction. For example, in the plan view, the upper opening 300b may extend in a diagonal direction having an inclination with the first direction. In the plan view, both sidewalls of the second opening may have a line shape parallel to the first direction.

A width in the second direction of the upper conductive line structure 310b may decrease from the first end 10 to the second end 12. A width in the second direction of the lower conductive line structure 310a may be the same at the first end 10a and the second end 12a.

In the conductive line structure 310, an address decoder X-DEC may be connected to portions adjacent to the first end 10 of the upper conductive line structure 310b.

In some example embodiments, although not shown, a width in the second direction of the lower conductive line structure may decrease from the first end to the second end. A width in the second direction of the upper conductive line structure may be the same at the first end and the second end.

As described above, in the plan view, at least one of the conductive lines included in the conductive line structure may have a non-rectangular shape.

Figure 16:
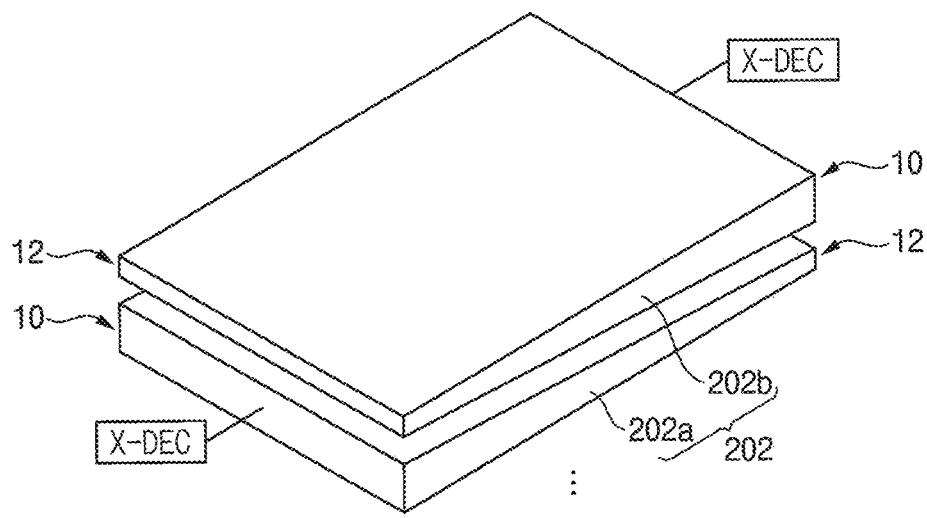

FIG. 16 is a perspective view illustrating a portion of a conductive line structure in the vertical semiconductor device in accordance with an example embodiment.

FIG. 16 illustrates a portion of conductive lines included in the conductive line structure, and channel structures are omitted to simplify FIG. 16. Although only two-layer conductive lines are illustrated in FIG. 16, a plurality of conductive lines may be repeatedly stacked in the vertical direction.

Referring to FIG. 16, the conductive line structure may have a structure in which the insulation layer and the conductive line 202 are alternately and repeatedly stacked. The conductive lines 202 may include first conductive lines 202a including odd-numbered layer conductive lines and second conductive lines 202b including even-numbered layer conductive lines. Thus, in the conductive line structure, the first conductive line 202a and the second conductive line 202b may be alternately stacked in the vertical direction.

The first conductive lines 202a and the second conductive lines 202b may have different shapes. Each of the first conductive lines 202a may have different thicknesses in the vertical direction according to positions thereof. Each of the second conductive lines 202b may have different thicknesses in the vertical direction according to positions thereof. The thickness of each of the first and second conductive lines 202a and 202b may decrease from the first end 10 to the second end 12. For example, the first end 10 of the first conductive lines 202a may be disposed at a left side, so that the thickness of the first conductive lines 202a may decrease from a left edge to a right edge. The first end 10 of the second conductive lines 202b may be disposed at a right side, so that the thickness of the second conductive lines 202b may decrease from a right edge to a left edge.

At least one of lower or upper surfaces of each of the first and second conductive lines 202a and 202b may not be parallel to a surface of the substrate, and may have an inclination with the surface of the substrate.

In some example embodiments, in the first and second conductive lines 202a and 202b adjacent to each other, the lower surface of the first conductive line 202a may have a planar shape parallel to the surface of the substrate, and the upper surface of the first conductive line 202a may have a planar shape having an inclination with respect to the surface of the substrate. The lower surface of the second conductive line 202b may have a planar shape having an inclination with respect to the surface of the substrate 100 to face the upper surface of the first conductive line 202a, and the upper surface of the second conductive line 202b may have a planar shape parallel to the surface of the substrate 100.

In a cross-section of the conductive line structure, each of the upper surface of the first conductive line 202a and the lower surface of the second conductive line 202b may have a diagonal shape having an inclination with the first direction. In the cross-section of the conductive line structure, each of the lower surface of the first conductive line 202a and the upper surface of the second conductive line 202b may have a line shape parallel to the first direction. In the cross-section of the conductive line structure, each of the first and second conductive lines 202a and 202b may have a trapezoidal shape with one side having the diagonal shape.

In the conductive line structure, an address decoder X-DEC may be connected to portions adjacent the first end of the first conductive line 202a and the first end of the second conductive line 202b. Thus, the address decoder X-DEC may be connected to the left edge of the first conductive line 202a, and the address decoder X-DEC may be connected to the right edge of the second conductive line 202b. As the address decoder is connected to edge portions having low resistance in the first and second conductive lines 202a and 202b, the RC delay of the first and second conductive lines 202a and 202b may be reduced.

Figure 17:
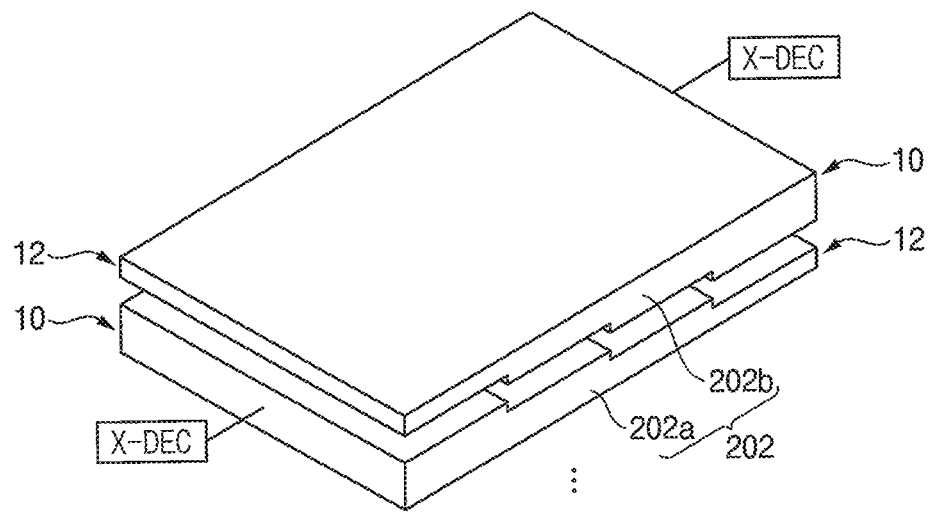

FIG. 17 is a perspective view illustrating a portion of a conductive line structure in a vertical semiconductor device in accordance with an example embodiment.

FIG. 17 illustrates a portion of a conductive line included in a conductive line structure, and channel structures are omitted to simplify FIG. 17.

The conductive line structure shown in FIG. 17 may be the same as or substantially similar to the conductive line structure shown in FIG. 16, except for shapes of the first conductive line and the second conductive line.

A thickness of each of the first and second conductive lines 202a and 202b may decrease from the first end 10 to the second end 12. For example, the first end 10 of the first conductive line 202a may be disposed at a left side, so that the thickness of the first conductive line 202a may decrease from a left edge to a right edge. The first end 10 of the second conductive line 202b may be disposed at a right side, so that the thickness of the second conductive line 202b may decrease from a right edge to a left edge.

At least one of lower or upper surfaces of the first and second conductive lines 202a and 202b may not have a flat surface but have a step shape.

In some example embodiments, in the first and second conductive lines 202a and 202b adjacent to each other, the lower surface of the first conductive line 202a may have a planar shape parallel to a surface of the substrate, and the upper surface of the first conductive line 202a may have a step shape. The lower surface of the second conductive line 202b may have a step shape to face the upper surface of the first conductive line 202a, and the upper surface of the second conductive line 202b may have a planar shape parallel to the surface of the substrate.

In a cross-section of the conductive line structure, the upper surface of the first conductive line 202a and the lower surface of the second conductive line 202b may have a step shape facing each other. In a cross-sectional view, the lower surface of the first conductive line 202a and the upper surface of the second conductive line 202b may have a line shape parallel to the first direction. Thus, in the cross-section of the conductive line structure, one side of each of the first and second conductive lines 202a and 202b may have a step shape.

In the conductive line structure, an address decoder X-DEC may be connected to portions adjacent to the first end 10 of the first conductive lines 202a and the first end 10 of the second conductive lines 202b. Thus, the address decoder X-DEC may be connected to a left edge of the first conductive lines 202a, and the address decoder X-DEC may be connected to a right edge of the second conductive lines 202b.

Figure 18:
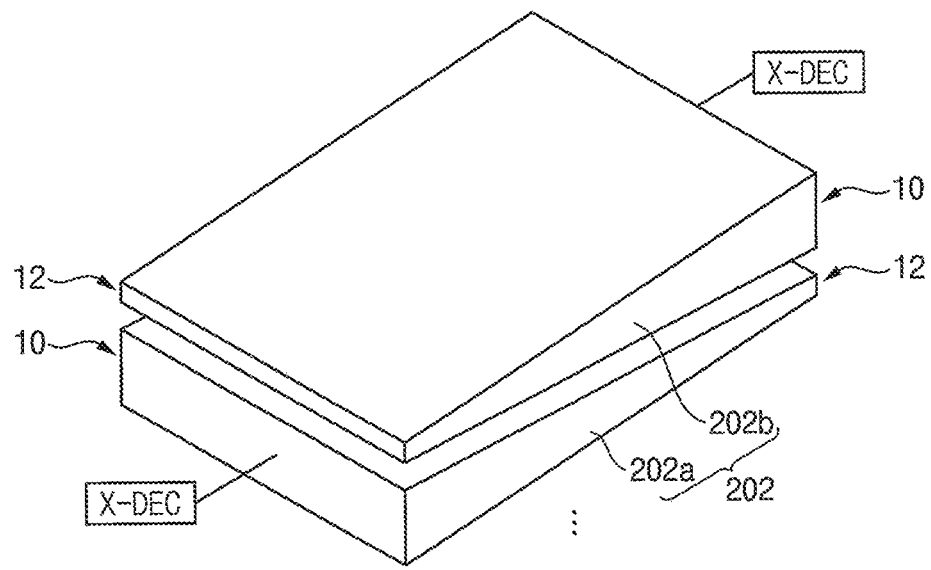

FIG. 18 is a perspective view illustrating a portion of a conductive line structure in a vertical semiconductor device in accordance with an example embodiment.

FIG. 18 illustrates a portion of a conductive line included in a conductive line structure, and channel structures are omitted to simplify FIG. 18.

The conductive line structure shown in FIG. 18 may be the same as or substantially similar to the conductive line structure shown in FIG. 16, except for shapes of the first conductive lines and the second conductive lines.

A thickness of each of the first and second conductive lines 202a and 202b may decrease from the first end 10 to the second end 12. For example, the first end 10 of the first conductive lines 202a may be disposed at a left side, so that the thickness of the first conductive lines 202a may decrease from a left edge to a right edge. The first end 10 of the second conductive lines 202b may be disposed at a right side, so that the thickness of the second conductive lines 202b may decrease from a right edge to a left edge.

Lower and upper surfaces of the first conductive line 202a and the second conductive line 202b may not be parallel to a surface of the substrate and may have an inclination with respect to the surface of the substrate.

In some example embodiments, in the first and second conductive lines 202a and 202b adjacent to each other, the upper surface of the first conductive line 202a and the lower surface of the second conductive line 202b may face each other. Each of the upper surface of the first conductive line 202a and the lower surface of the second conductive line 202b may have a planar shape having an inclination with respect to the surface of the substrate. The lower surface of the first conductive line 202a and the upper surface of the second conductive line 202b may face each other, and may have a planar shape having an inclination with respect to the surface of the substrate.

In a cross-section of the conductive line structure, each of the upper surface of the first conductive line 202a and the lower surface of the second conductive line 202b may have a diagonal shape having an inclination with the first direction. In a cross-sectional view, each of the lower surface of the first conductive line 202a and the upper surface of the second conductive line 202b may have a diagonal shape having an inclination with the first direction. In the cross-section of the conductive line structure, the first and second conductive lines 202a and 202b may have an isosceles trapezoidal shape, so that each of both sides of the first and second conductive line structures 210a and 210b may have a diagonal shape.

In the conductive line structure, an address decoder X-DEC may be connected to portions adjacent to the first end 10 of the first conductive lines 202a and the first end 10 of the second conductive lines 202b. Thus, the address decoder X-DEC may be connected to the left edge of the first conductive lines 202a, and the address decoder X-DEC may be connected to the right edge of the second conductive lines 202b.

Figure 19:
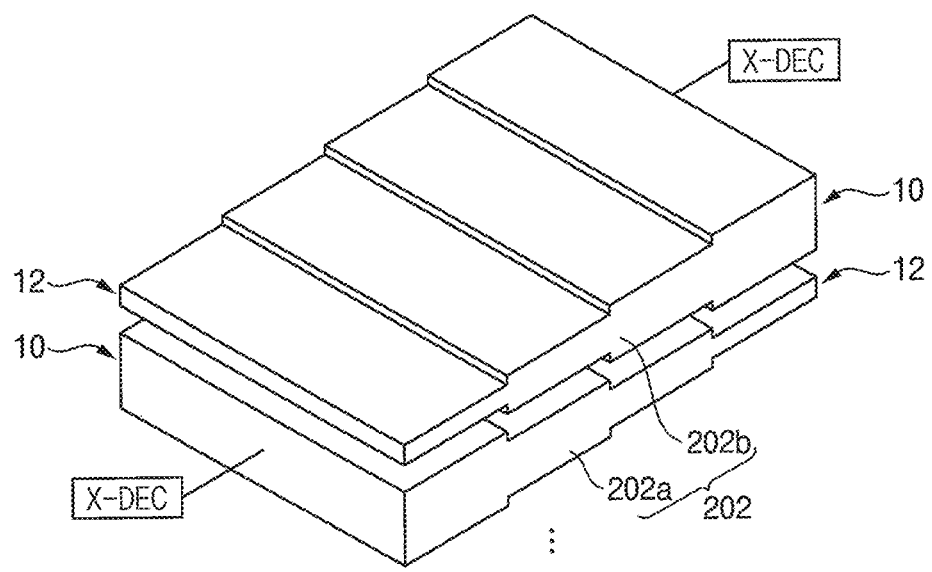

FIG. 19 is a perspective view illustrating a portion of a conductive line structure in a vertical semiconductor device in accordance with an example embodiment.

FIG. 19 illustrates a portion of conductive lines included in a conductive line structure, and channel structures are omitted to simplify FIG. 19.

The conductive line structure shown in FIG. 19 may be the same as or substantially similar to the conductive line structure shown in FIG. 16, except for shapes of the first conductive lines and the second conductive lines.

A thickness of each of the first and second conductive lines 202a and 202b may decrease from the first end 10 to the second end 12. For example, the first end 10 of the first conductive lines 202a may be disposed at a left side, and thus the thickness of the first conductive lines 202a may decrease from a left edge to a right edge. The first end 10 of the second conductive lines 202b may be disposed at a right side, and thus the thickness of the second conductive lines 202b may decrease from a right edge to a left edge.

Lower and upper surfaces of the first conductive line 202a and the second conductive line 202b may have step shapes.

In some example embodiments, in the first and second conductive lines 202a and 202b adjacent to each other, the upper surface of the first conductive line 202a and the lower surface of the second conductive line 202b may face each other. The upper surface of the first conductive line 202a and the lower surface of the second conductive line 202b may have step shapes. Also, the lower surface of the first conductive line 202a and the upper surface of the second conductive line 202b may face each other, and may have step shapes.

In a cross-section of the conductive line structure, both sides corresponding to the upper and lower surfaces of the first conductive line 202a may have step shapes. In the cross-section of the conductive line structure, both sides corresponding to the lower and upper surfaces of the second conductive line 202b may have step shapes.

In the conductive line structure, an address decoder X-DEC may be connected to portions adjacent to the first end 10 of the first conductive lines 202a and portions adjacent to the first end 10 of the second conductive lines 202b. Thus, the address decoder X-DEC may be connected to the left edge of the first conductive lines 202a. The address decoder X-DEC may be connected to the right edge of the second conductive lines 202b.

FIGS. 20 to 28 are plan views and cross-sectional views illustrating a method of manufacturing a vertical semiconductor device in accordance with an example embodiment.

Figure 20:
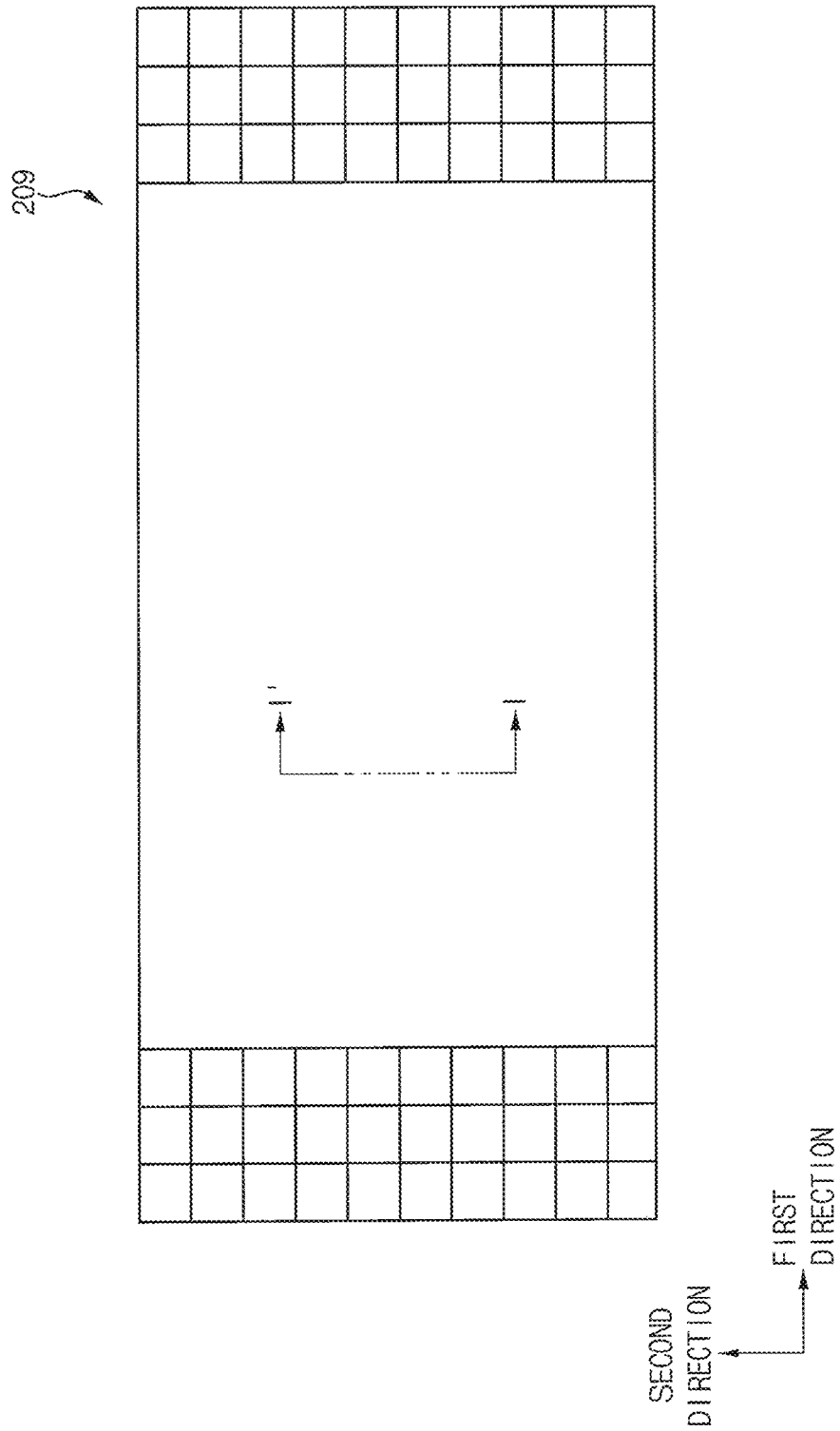
Figure 21:
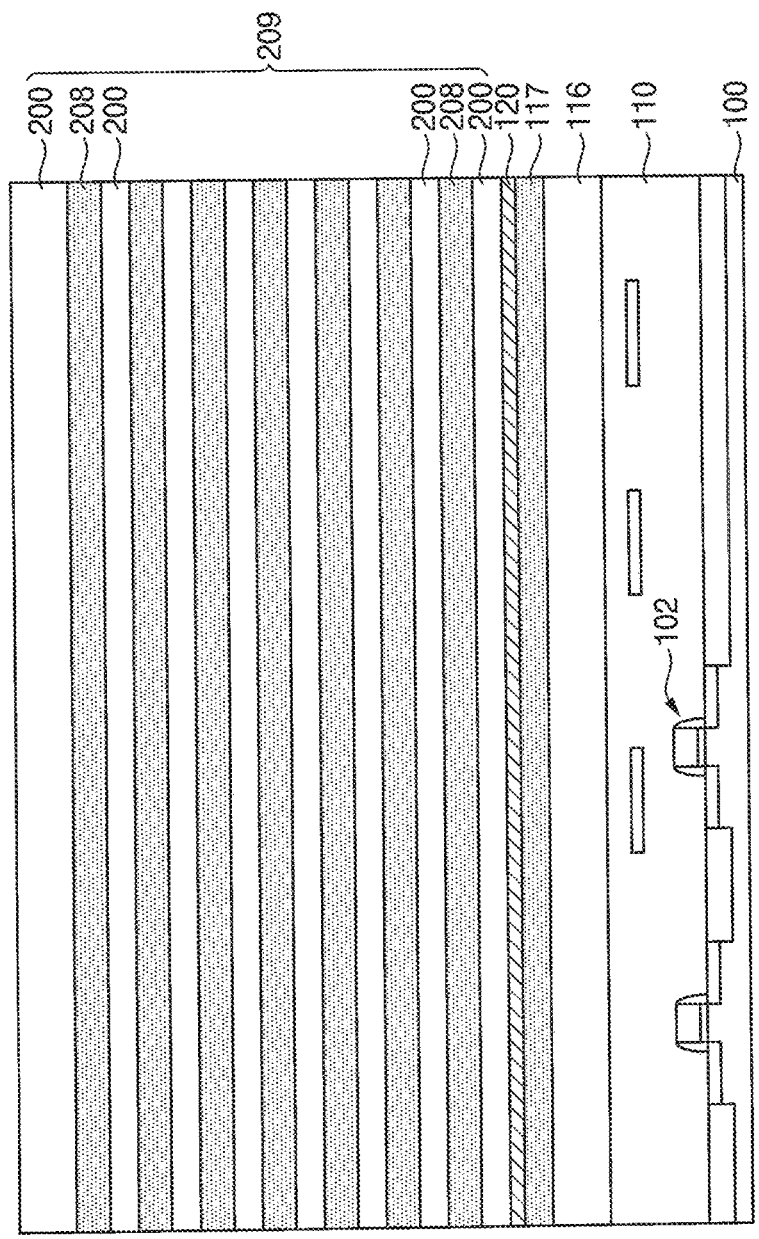
Figure 22:
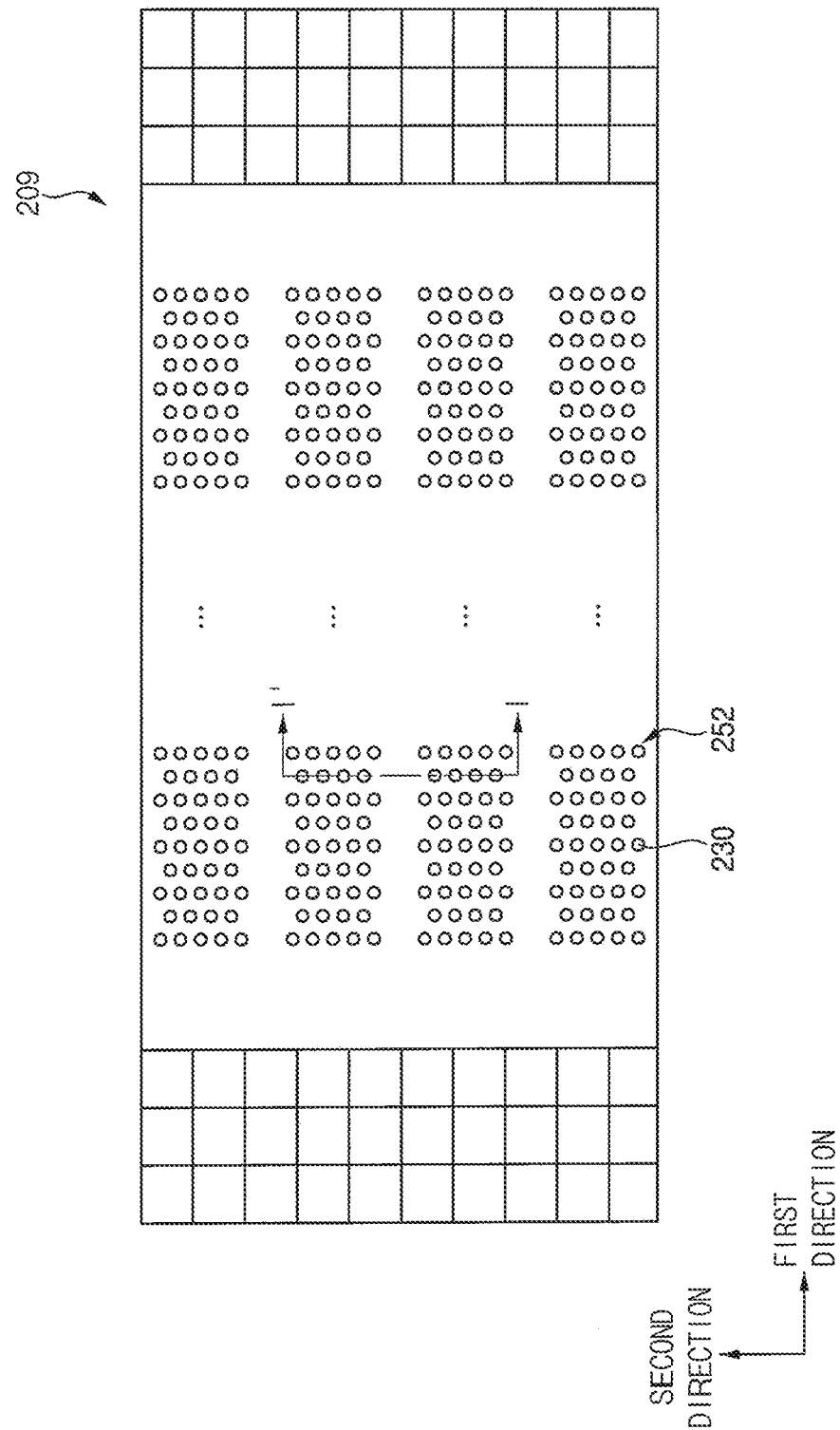
Figure 23:
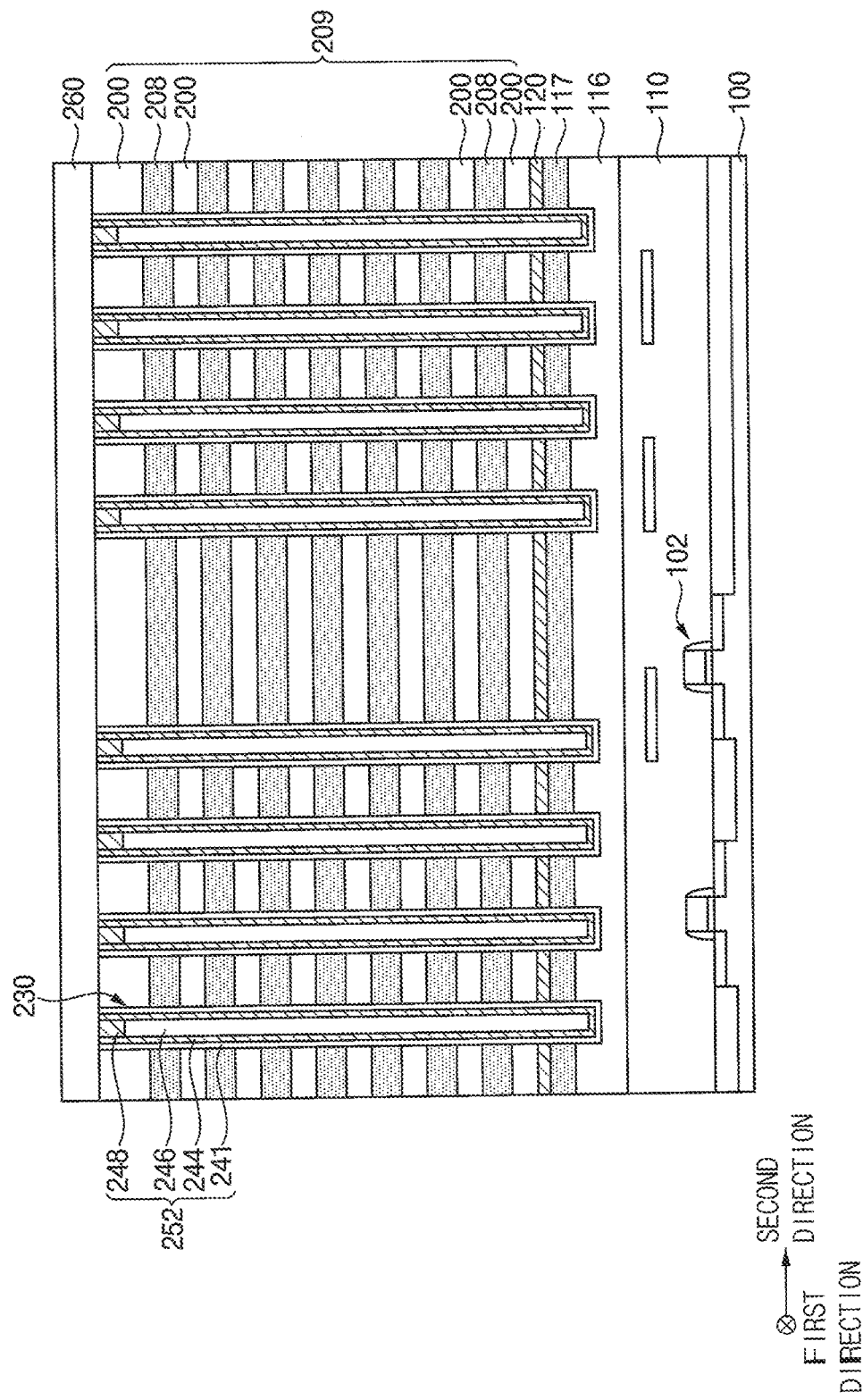
Figure 24:
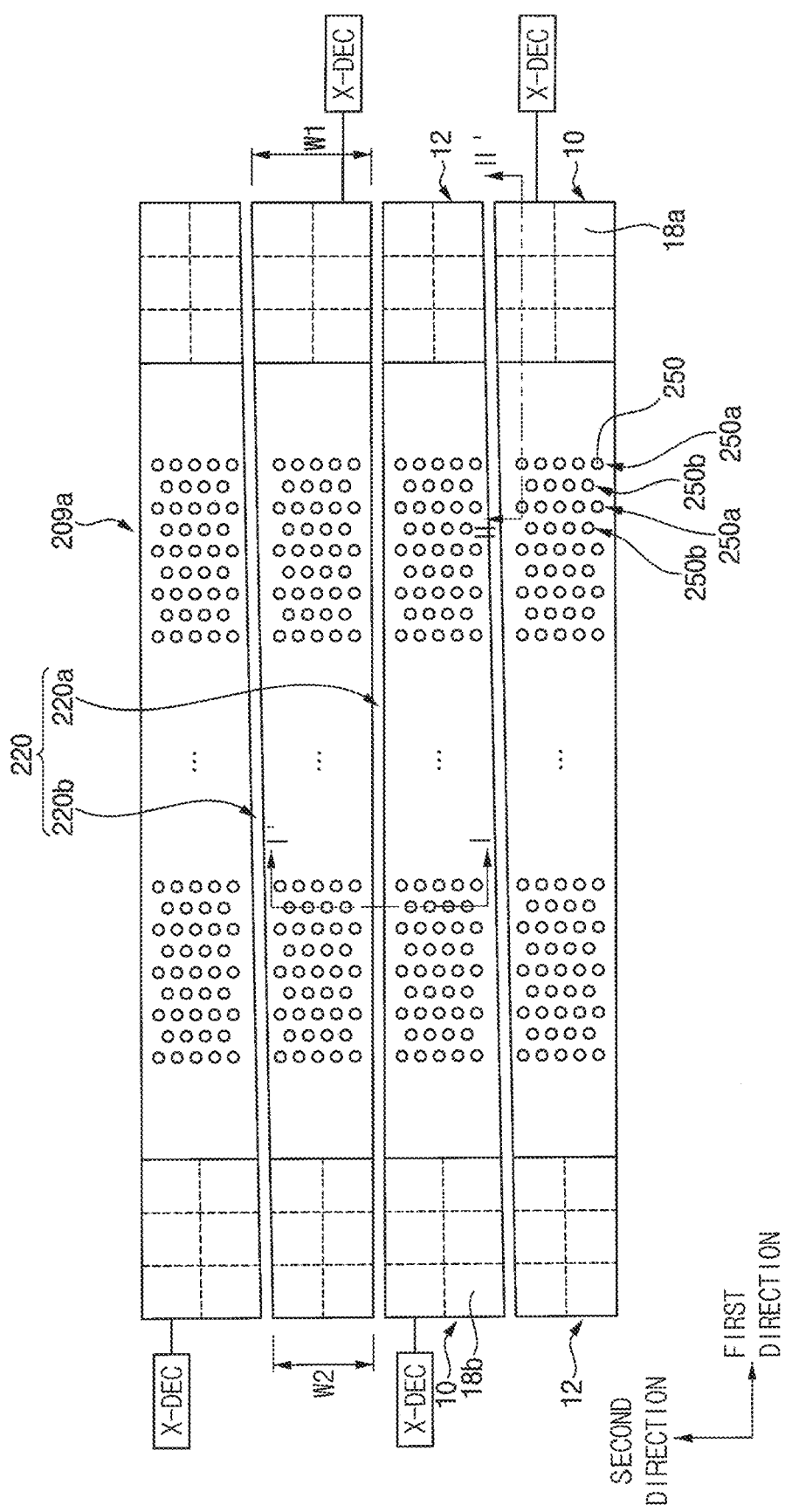

For example, FIGS. 20, 22 and 24 are plan views. FIGS. 21, 23, 25, 26 and 27 are cross-sectional views taken along a line I-I' of FIG. 20. FIG. 28 is a cross-sectional view taken along a line II-II' of FIG. 24.

Referring to FIGS. 20 and 21, a circuit pattern 102 constituting a peripheral circuit is formed on a substrate 100, and a lower insulating interlayer 110 may be formed to cover the circuit pattern 102.

A base pattern 116 may be formed on the lower insulating interlayer 110. A lower sacrificial layer 117 and a support layer 120 may be formed on the base pattern 116.

An insulation layer 200 and a first sacrificial layer 208 may be alternately and repeatedly stacked on the support layer 120. The insulation layer 200 may include silicon oxide. The first sacrificial layer 208 may include a material having an etch selectivity with respect to the insulation layer 200. The first sacrificial layer 208 may include, e.g., a nitride such as silicon nitride.

Thereafter, the insulation layers 200 and the first sacrificial layers 208 may be patterned to form a preliminary mold structure 209. Both edges in the first direction of the preliminary mold structure 209 may have step shapes.

Referring to FIGS. 22 and 23, an insulation layer may be formed on the preliminary mold structure 209. An upper surface of the insulation layer may be planarized to form an insulating interlayer (not shown) covering a step portion of the preliminary mold structure 209.

Channel holes 230 may be formed through the preliminary mold structure 209. The channel holes may extend to the base pattern 116.

A preliminary channel structure 252 may be formed in the channel holes 230. In some example embodiments, the preliminary channel structure 252 may include a preliminary charge storage structure 241, a channel 244, a filling insulation pattern 246, and a capping pattern 248. The preliminary charge storage structure 241 may include a preliminary first blocking layer, a preliminary charge storage layer, and a preliminary tunnel insulation layer sequentially stacked on the sidewall of the channel hole 230.

A first upper insulating interlayer 260 may be formed on the preliminary mold structure 209, the preliminary channel structure 252, and the first insulating interlayer.

Figure 25:
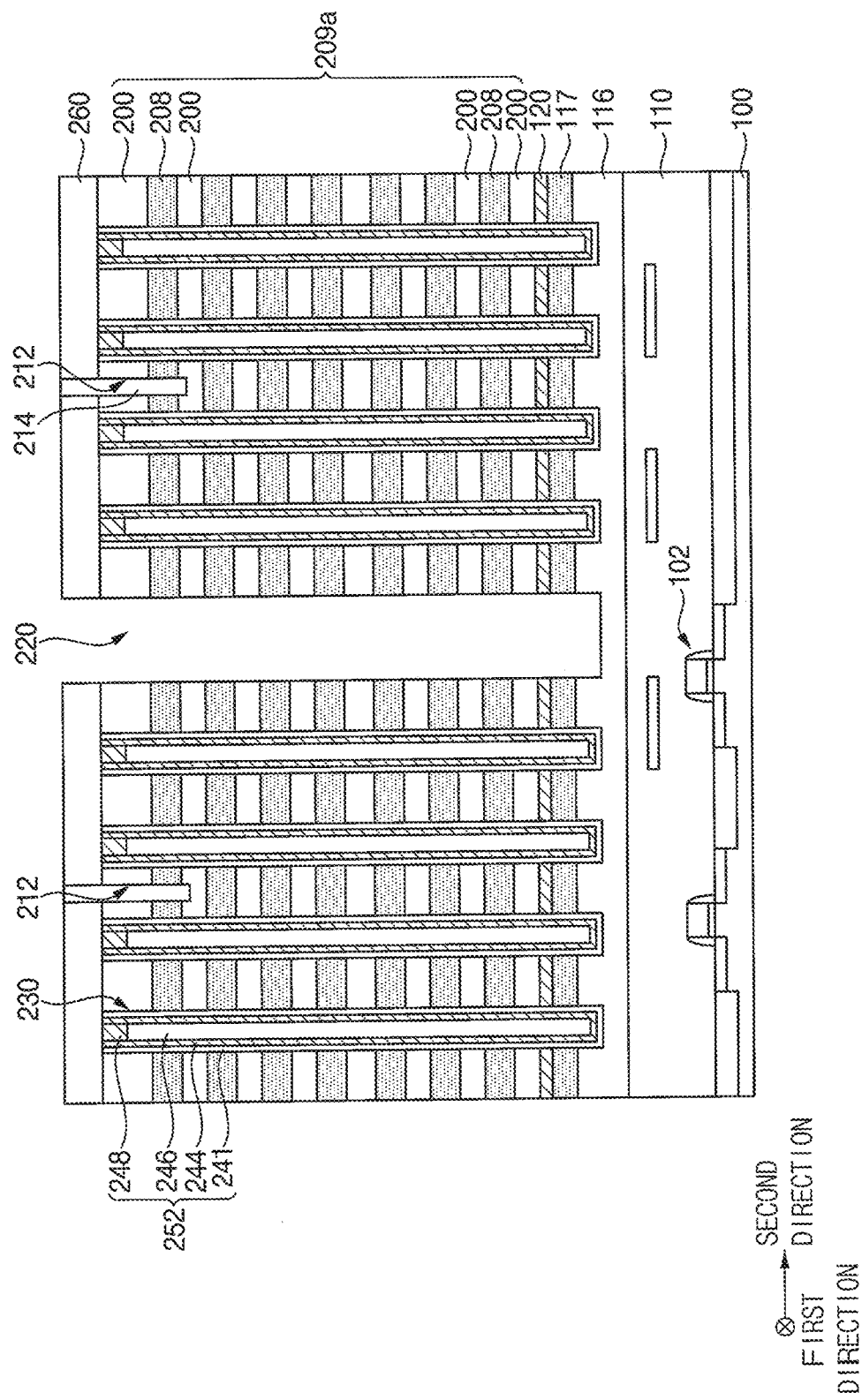

Referring to FIGS. 24 and 25, the first upper insulating interlayer 260, at least one insulation layer 200, and at least one first sacrificial layer 208 may be etched to form an upper trench 212 serving as SSL cutting portion. At least one first sacrificial layer 208 may be cut by the upper trench 212. A first insulation pattern 214 may be formed in the upper trench 212.

The first upper insulating interlayer 260, the first insulating interlayer, the preliminary mold structure 209, the support layer 120, and the lower sacrificial layer 117 may be etched to form an opening 220. The opening 220 may extend in the first direction. Thus, the preliminary mold structure 209 may be cut to form a mold structure 209a having a line shape.

Sidewalls of the opening 220 may correspond to sidewalls of adjacent conductive line structures subsequently formed. Thus, according to a shape of the opening 220, one of the vertical semiconductor devices shown in FIGS. 4 to 11 may be manufactured by subsequent process.

For example, a first opening 220a corresponding to a first sidewall of the mold structure 209a may have a line shape parallel to the first direction, and a second opening 220b corresponding to a second sidewall facing the first sidewall of the mold structure 209a may have a diagonal shape having an inclination with respect to the first direction. In a plan view, the mold structure 209a may have a trapezoidal shape with one side having a diagonal shape. In this case, the conductive line structure shown in FIGS. 3 to 7 may be formed by subsequent processes.

For example, a first opening corresponding to a first sidewall of the mold structure 209a may have a line shape parallel to the first direction. In a plan view, a second opening corresponding to a second sidewall facing the first sidewall of the mold structure 209a may have a step shape. In this case, the conductive line structure shown in FIG. 9 may be formed by subsequent processes.

For example, both sidewalls of the first and second openings corresponding to a first sidewall and a second sidewall of the mold structure 209a may have diagonal shapes having an inclination with the first direction. In a plan view, the mold structure 209a may have an isosceles trapezodal shape. In this case, the conductive line structure shown in FIG. 10 may be formed by subsequent processes.

For example, both sidewalls of the first and second openings corresponding to a first sidewall and a second sidewall of the mold structure 209a may have step shapes. In a plan view, both sides of the mold structure 209a may have step shapes, and a width in the second direction may decrease from the first edge to the second edge. In this case, the conductive line structure shown in FIG. 11 may be formed by subsequent processes.

Figure 26:
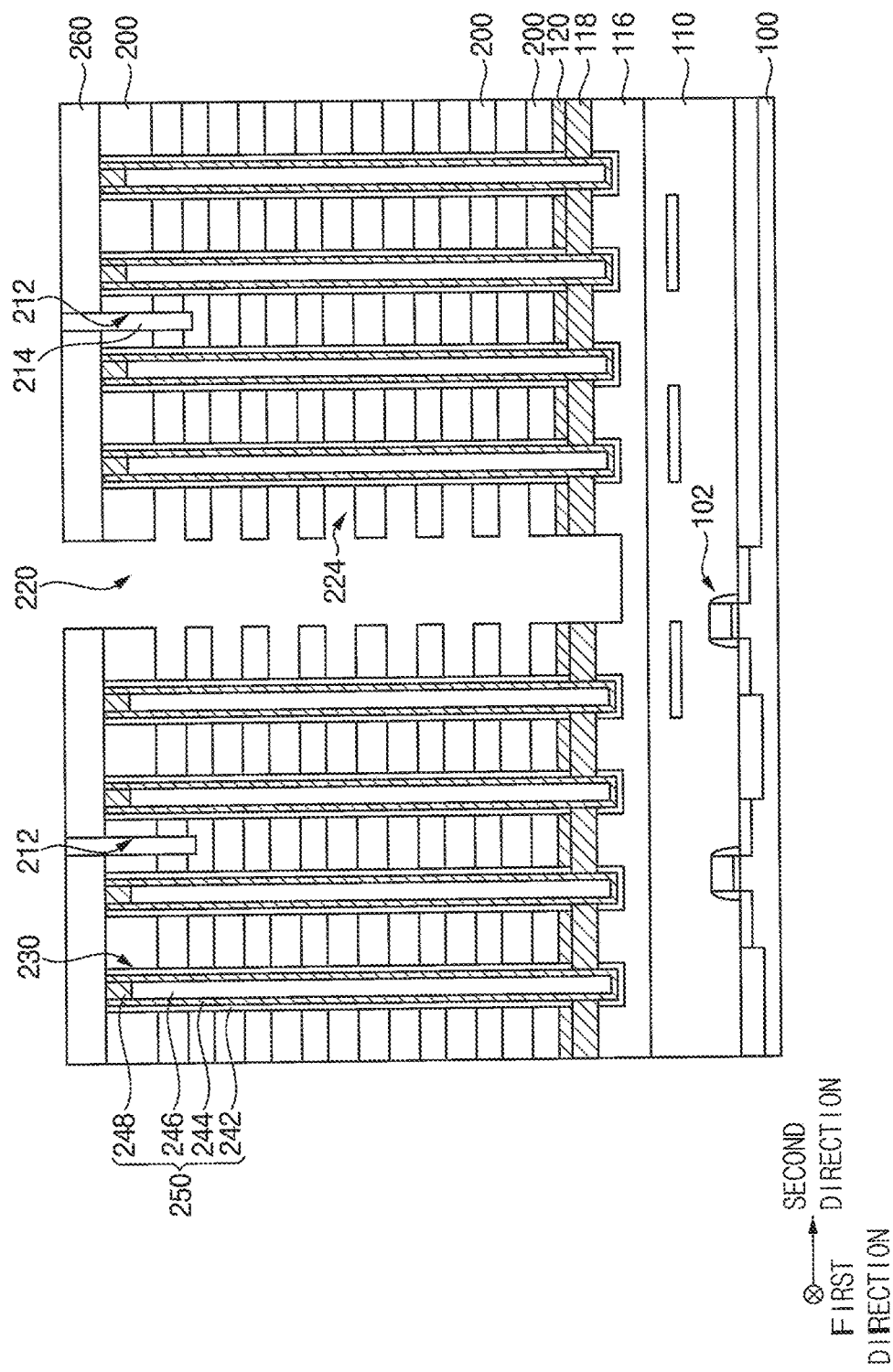

Referring to FIG. 26, a spacer (not shown) may be formed on the sidewalls of the opening 220 positioned higher than a lower surface of the support layer 120. The lower sacrificial layer 117 may be selectively removed to form first gap (not shown). The preliminary charge storage structure 241 exposed by the first gap may be etched to form a charge storage structure 242. A portion of the lower portion of the channel 244 may be exposed by the etching process. Thus, the channel structure 250 may be formed in the channel hole 230.

A channel connection pattern 118 may be formed to fill the first gap. Channels 244 formed in channel holes 230 may be electrically connected to each other by the channel connection pattern 118. The channel connection pattern 118 may include polysilicon.

The spacer may be removed, so that sidewalls of the mold structure 209a may be exposed by the opening 220. Thereafter, the first sacrificial layer 208 included in the mold structure 209a may be removed to form a second gap 224. The removal process may include a wet etching process.

Figure 27:
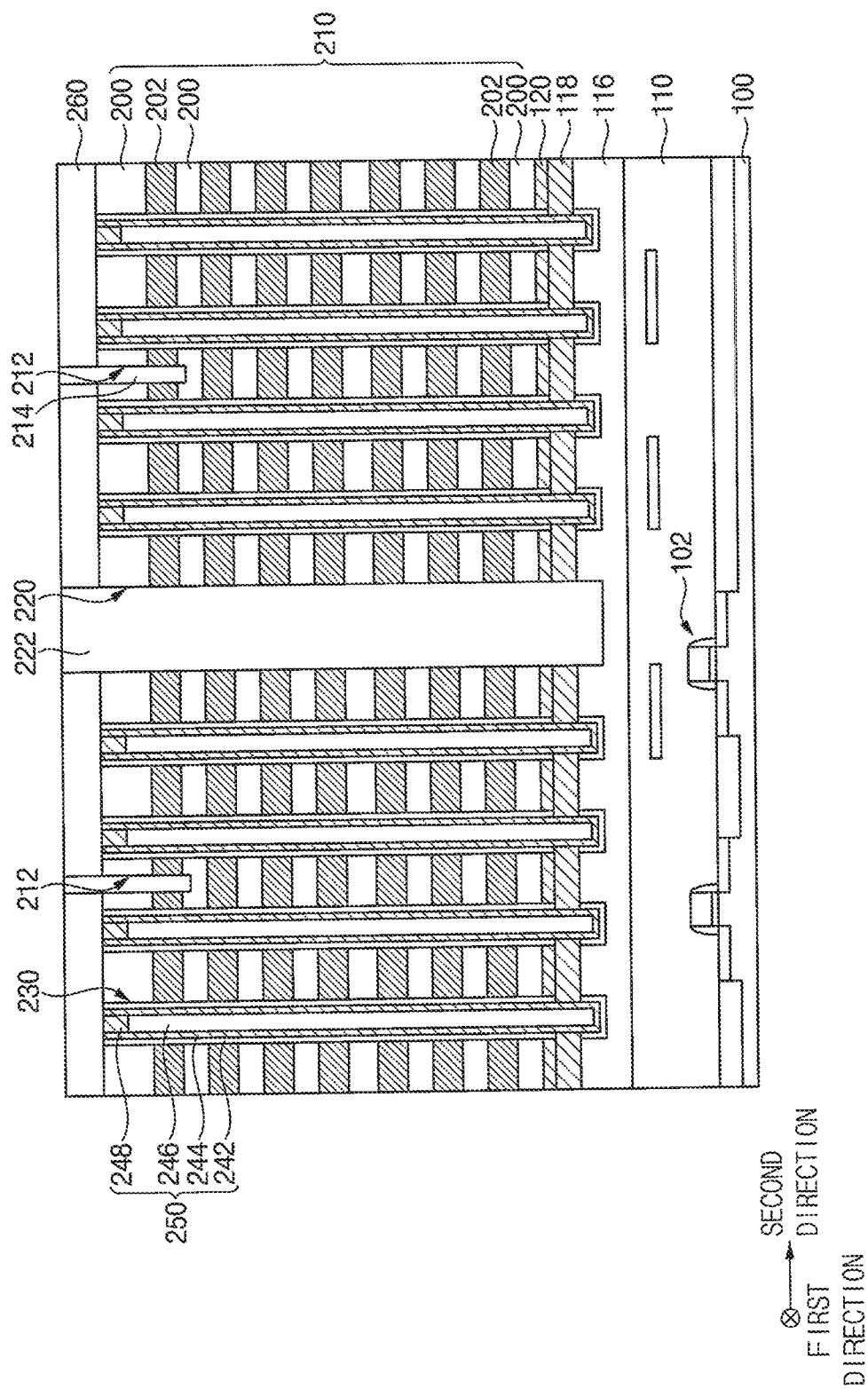
Figure 28:
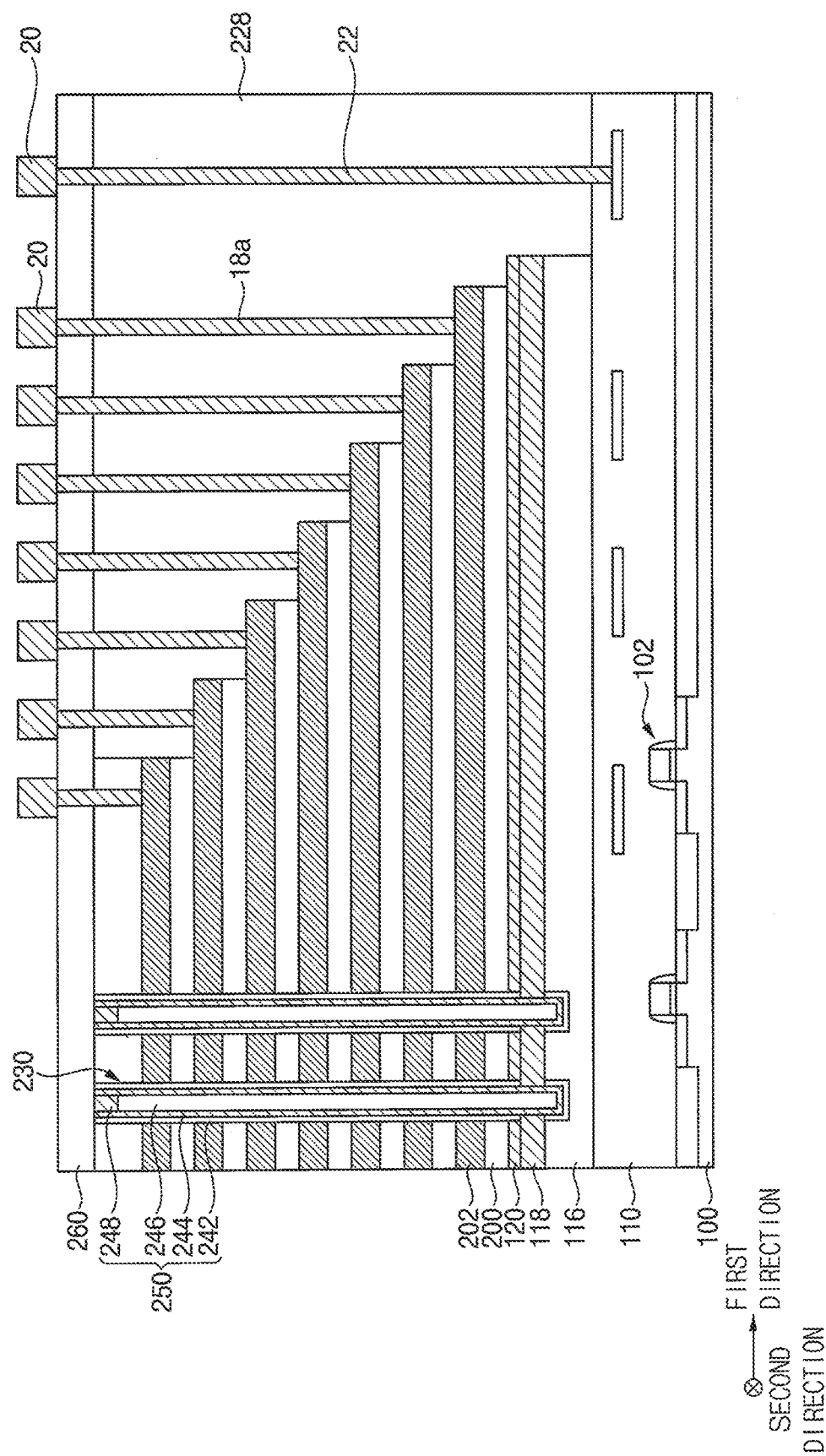

Referring to FIGS. 27 and 28, a first barrier metal layer may be formed on a surface of the second gap 224, and a metal layer may be formed on the first barrier metal layer to fill the second gap 224. In some example embodiments, before forming the first barrier metal layer, a second blocking layer may be further formed on the surface of the second gap 224. The second blocking layer may include aluminum oxide.

The first barrier metal layer may include, e.g., titanium, titanium nitride, tantalum, or tantalum nitride. The metal layer may include a metal material such as tungsten, copper, or aluminum.

Thereafter, the first barrier metal layer and the metal layer may be partially etched so that the first barrier metal layer and the metal layer remain only in the second gaps 224. Thus, conductive lines 202 may be formed in the second gaps 224.

Accordingly, a conductive line structure 210 in which the conductive line 202 and the insulating layer 200 are alternately and repeatedly stacked may be formed. The conductive line structure 210 may extend in the first direction. An edge in the first direction of the conductive line structure 210 may have a step shape.

An insulation pattern 222 may be formed in the opening 220.

Thereafter, first contact plugs 18a and second contact plugs 18b (refer to FIG. 4) may be formed through the first upper insulating interlayer 260 and the insulating interlayer 228. The first contact plugs 18a and the second contact plugs 18b may contact the upper surfaces of the conductive lines 202 at step portions of the conductive line structure 210. The first contact plugs 18a and the second contact plugs 18b may be disposed at first ends of the conductive lines 202.

For forming the first and second contact plugs 18a and 18b, the first upper insulating interlayer 260 and the insulating interlayer 228 may be etched to form contact holes exposing the upper surface of each conductive line 202. A barrier metal layer may be formed on inner surfaces of the contact holes, and a metal layer may be formed on the barrier metal layer to fill the contact holes. The metal layer and the barrier metal layer may be planarized until an upper surface of the first upper insulating interlayer 260 may be exposed.

Wirings for connecting the first contact plugs 18a and the second contact plugs 18b to the circuit pattern 102 corresponding to the address decoder X-DEC may be formed. For example, each of the wirings may include a conductive pattern 20 and a through via 22.

Any functional blocks shown in the figures and described above may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical semiconductor device, comprising:
   a first conductive line structure on a substrate, the first conductive line structure including conductive lines and insulation layers being alternately and repeatedly stacked in a vertical direction perpendicular to a surface of the substrate; and
   an address decoder connected to a first end of each of conductive lines included in the first conductive line structure, the address decoder configured to apply electrical signals to the conductive lines,
   wherein in each of the conductive lines, a first portion adjacent to the first end and a second portion adjacent to a second end that is opposite to the first end have different shapes, and
   wherein a first resistance in the first portion is lower than a second resistance in the second portion.

2. The vertical semiconductor device of claim 1, wherein a first parasitic capacitance in the first portion is greater than a second parasitic capacitance in the second portion.

3. The vertical semiconductor device of claim 1, wherein, in a plan view, at least one side in a longitudinal direction of each of the conductive lines extends to have an inclination with respect to a first direction, the first direction being parallel to the surface of the substrate.

4. The vertical semiconductor device of claim 1, wherein, in a plan view, a first width of the first portion is greater than a second width of the second portion.

5. The vertical semiconductor device of claim 4, wherein, in the plan view,
   each of the conductive lines has a trapezoidal shape,
   a first side in a longitudinal direction of each of the conductive lines is parallel to a first direction, the first direction being parallel to the surface of the substrate, and
   a second side facing the first side extends at an inclination with respect to the first direction.

6. The vertical semiconductor device of claim 4, wherein, in the plan view,
   each of the conductive lines has an isosceles trapezoidal shape, and
   first and second sides of each of the conductive lines that face each other in a longitudinal direction thereof extend at an inclination with respect to a first direction on a same plane, the first direction being parallel to the surface of the substrate.

7. The vertical semiconductor device of claim 4, wherein, in the plan view,
   an upper side of each of the conductive lines has a step shape, and
   a lower side of each of the conductive lines extends parallel to the surface of the substrate.

8. The vertical semiconductor device of claim 4, wherein, in the plan view, an upper side and a lower side of each of the conductive lines has a step shape.

9. The vertical semiconductor device of claim 1, wherein, in a cross-sectional view, in each of the conductive lines, a first thickness of the first portion is greater than a second thickness of the second portion.

10. A vertical semiconductor device, comprising:
    a first conductive line structure on a substrate, the first conductive line structure including first conductive lines and first insulation layers being alternately and repeatedly stacked in a vertical direction perpendicular to an upper surface of the substrate, the first conductive line structure elongating in a first direction, the first direction being parallel to the upper surface of the substrate, each of the first conductive lines including a first end and a second end opposite to the first end;
    a second conductive line structure on the substrate, the second conductive line structure including second conductive lines and second insulation layers being alternately and repeatedly stacked in the vertical direction, the second conductive line structure elongating in the first direction, each of the second conductive lines including a third end and a fourth end opposite to the third end;
    a first address decoder connected to the first end and configured to apply electrical signals; and
    a second address decoder connected to the third end and configured to apply electrical signals, wherein the first conductive line structure and the second conductive line structure alternate in a second direction, the second direction being parallel to the upper surface of the substrate and being perpendicular to the first direction, and the first conductive line structure and the second conductive line structure being separated by an opening interposed therebetween and extending in the first direction, wherein, in a plan view, a first width in a first portion adjacent to the first end is greater than a second width in a second portion adjacent to the second end in each of the first conductive lines, wherein, in the plan view, a third width in a third portion adjacent to the third end is greater than a fourth width in a fourth portion adjacent to the fourth end in each of the second conductive lines, and wherein the third end is adjacent to the second end in the second direction.

11. The vertical semiconductor device of claim 10, wherein the opening includes a plurality of opening including a first opening and a second opening, the first opening exposing a first sidewall of the first conductive line structure, the second opening exposing a second sidewall opposite to the first sidewall of the first conductive line structure; and at least one of the first opening or the second opening elongates in the first direction so as not to be parallel to the first direction.

12. The vertical semiconductor device of claim 11, wherein both sidewalls of at least one of the first opening or the second opening elongate in a diagonal direction inclined with respect to the first direction.

13. The vertical semiconductor device of claim 11, wherein both sidewalls of at least one of the first opening or the second opening extend in a stepped shape.

14. The vertical semiconductor device of claim 10, wherein the opening includes a plurality opening including a lower opening and an upper opening, the lower opening and the upper opening communicating with each other in the vertical direction, one of the lower opening and the upper opening extends at an inclination with respect to the first direction, and the other one of the lower opening and the upper opening extends in parallel with the first direction.

15. The vertical semiconductor device of claim 10, further comprising:

a channel structure extending in the vertical direction through the first and second conductive line structures, and the channel structure including a channel, a dielectric layer structure, a filling insulation pattern, and a capping pattern.

16. A vertical semiconductor device, comprising:

a conductive line structure on a substrate, the conductive line structure including first conductive lines and first insulation layers being alternately and repeatedly stacked in a vertical direction perpendicular to a surface of the substrate;

upper conductive lines on the conductive line structure; and an address decoder connected to a first end of each of the first conductive lines included in the conductive line structure and configured to apply electrical signals, wherein the upper conductive lines include a trench therebetween, and the trench extends in a diagonal direction inclined with respect to a first direction parallel to the surface of the substrate, wherein, in a plan view, the middle one of the three upper conductive lines has an isosceles trapezoidal shape.

17. The vertical semiconductor device of claim 16, wherein both sidewalls of the conductive line structure elongate in parallel with the first direction.

18. The vertical semiconductor device of claim 16, wherein the upper conductive lines include three upper conductive lines on the conductive line structure, wherein, in a plan view, a first width of in a first portion adjacent to a first end of a middle one of the three upper conductive lines between upper trenches is greater than a second width of a second portion adjacent to a second end of the middle one of the three upper conductive lines, the second end being opposite to the first end of the middle upper conductive line.

19. The vertical semiconductor device of claim 18, further comprising:

a channel structure extending in the vertical direction through the conductive line structure and upper conductive lines on the conductive line structure, the channel structure including a channel, a dielectric layer structure, a filling insulation pattern, and a capping pattern.

* * * * *